(12) United States Patent
Kang et al.

(10) Patent No.: US 11,651,710 B2
(45) Date of Patent: May 16, 2023

(54) DISPLAY DEVICE

(71) Applicant: LG Display Co., Ltd., Seoul (KR)

(72) Inventors: ChounSung Kang, Gimpo-si (KR);
Mi-Na Shin, Paju-si (KR); GeunChang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 195 days.

(21) Appl. No.: 16/994,361

(22) Filed: Aug. 14, 2020

(65) Prior Publication Data
US 2021/0090476 A1   Mar. 25, 2021

(30) Foreign Application Priority Data
Sep. 19, 2019   (KR) .................. 10-2019-0115300

(51) Int. Cl.
*G09F 9/30* (2006.01)
*H01L 51/52* (2006.01)
*H01L 27/32* (2006.01)

(52) U.S. Cl.
CPC .......... *G09F 9/301* (2013.01); *H01L 27/3246* (2013.01); *H01L 51/5246* (2013.01)

(58) Field of Classification Search
CPC . G09F 9/301; G09F 9/335; G09F 9/33; G09F 9/35; H01L 27/3246; H01L 51/5246; H01L 27/3244; G06F 1/1652; G06F 2203/04102
See application file for complete search history.

(56) References Cited

U.S. PATENT DOCUMENTS

| | | | |
|---|---|---|---|
| 9,760,975 | B2 | 9/2017 | Kim et al. |
| 10,684,652 | B2 | 6/2020 | Kim et al. |
| 11,013,130 | B2 | 5/2021 | Shin et al. |
| 2008/0212271 | A1 | 9/2008 | Misawa |
| 2016/0014919 | A1 | 1/2016 | Huitema et al. |
| 2017/0060183 | A1 | 3/2017 | Zhang et al. |
| 2017/0161868 | A1 | 6/2017 | Kim et al. |
| 2017/0235341 | A1 | 11/2017 | Seo et al. |
| 2017/0325343 | A1 | 11/2017 | Seo et al. |
| 2018/0077808 | A1* | 3/2018 | Seo ............... G06F 3/044 |
| 2018/0101200 | A1 | 4/2018 | Myeong et al. |
| 2019/0064881 | A1 | 2/2019 | Kim et al. |

(Continued)

FOREIGN PATENT DOCUMENTS

| | | |
|---|---|---|
| CN | 204215671 U | 3/2015 |
| CN | 104879685 A | 9/2015 |

(Continued)

OTHER PUBLICATIONS

First Office Action, China National Intellectual Property Administration Patent Application No. 202010952117.5, dated May 27, 2022, 22 pages.

(Continued)

*Primary Examiner* — Kevin Quarterman
(74) *Attorney, Agent, or Firm* — Fenwick & West LLP

(57) ABSTRACT

Disclosed herein is a display device. The display device comprises: a mid cover; a display panel disposed on the mid cover and having a plurality of pixels defined therein; a plurality of back bars disposed under the mid cover; and a roller fixed to the mid cover. The mid cover, the display panel and the plurality of back bars are wound around or unwound from the roller.

20 Claims, 16 Drawing Sheets

(56) References Cited

U.S. PATENT DOCUMENTS

| | | | | |
|---|---|---|---|---|
| 2019/0138058 A1* | 5/2019 | Kwon | ............... | G09G 3/22 |
| 2019/0150300 A1* | 5/2019 | Kim | ............... | H05K 5/0217 |
| | | | | 361/807 |
| 2019/0324501 A1* | 10/2019 | Kim | ............... | G06F 1/1675 |
| 2020/0008308 A1* | 1/2020 | Shin | ............... | H05K 5/0017 |
| 2020/0077194 A1* | 3/2020 | Kim | ............... | H04R 7/045 |
| 2020/0093011 A1* | 3/2020 | Lee | ............... | G06F 1/1652 |
| 2020/0314552 A1* | 10/2020 | Kim | ............... | H04R 7/045 |
| 2021/0176873 A1 | 6/2021 | Shin et al. | | |
| 2021/0240294 A1* | 8/2021 | Ko | ............... | G06F 3/0416 |

FOREIGN PATENT DOCUMENTS

| | | |
|---|---|---|
| CN | 108369789 A | 8/2018 |
| KR | 101945985 B1 | 2/2019 |
| KR | 10-2019-0023919 A | 3/2019 |
| KR | 10-1966787 B1 | 4/2019 |
| WO | WO 2015/088207 A1 | 6/2015 |

OTHER PUBLICATIONS

China National Intellectual Property Administration, Notice of Decision of Granting, CN Patent Application No. 202010952117.5, dated Jan. 20, 2023, seven pages.

* cited by examiner

DISPLAY DEVICE

CROSS-REFERENCE TO RELATED APPLICATION

This application claims priority to Republic of Korea Patent Application No. 10-2019-0115300 filed in the Korean Intellectual Property Office on Sep. 19, 2019, the disclosure of which is incorporated herein by reference in its entirety.

BACKGROUND

Technical Field

The present disclosure relates to a display device, and more particularly to a rollable display device that can display images even when it is rolled.

Description of the Related Art

Display devices employed by the monitor of a computer, a TV, a mobile phone or the like include an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger display area with reduced volume and weight.

In addition, a rollable display device is attracting attention as the next generation display device. Such a rollable display device is fabricated by forming a display part and lines on a flexible substrate made of a flexible material such as plastic so that it is able to display images even if it is rolled.

SUMMARY

In view of the above, an object of the present disclosure is to provide a display device that includes a mid cover as well as a plurality of back bars on the rear side of a display panel so that stress applied to the display panel in the course of winding the display device can be reduced.

Another object of the present disclosure is to provide a display device that reduces the thickness of the display part and improves the side strength of the display panel.

Still another object of the present disclosure is to provide a display device that suppresses wrinkles on the display panel which may occur when the display device is wound and unwound to thereby improve the reliability.

Objects of the present disclosure are not limited to the above-mentioned objects, and other objects, which are not mentioned above, can be clearly understood by those skilled in the art from the following descriptions.

According to an aspect of the present disclosure, there is provided a display device including a mid cover; a display panel disposed on a surface of the mid cover and having a plurality of pixels defined therein; a plurality of back bars disposed on an opposite surface of the mid cover; and a roller fixed to the mid cover. The mid cover, the display panel and the plurality of back bars are wound around or unwound from the roller.

According to another aspect of the present disclosure, there is provided a display device including: a roller; a mid cover fixed to the roller; a first adhesive layer disposed on an upper surface of the mid cover; a display panel attached to the mid cover by the first adhesive layer; a second adhesive layer disposed on a lower surface of the mid cover; and a plurality of back bars attached to the mid cover by the second adhesive layer.

Other detailed matters of the exemplary embodiments are included in the detailed description and the drawings.

According to an exemplary embodiment of the present disclosure, a mid cover and a plurality of back bars are disposed so that they cover a display area of a display panel, thereby improving side strength of the display panel and flatness of a display part to improve the reliability of the display device.

According to an exemplary embodiment of the present disclosure, the mid cover as well as the plurality of back bars give strength to the display panel, and thus the thickness of the display panel can be reduced.

According to an exemplary embodiment of the present disclosure, it is possible to prevent the plurality of back bars from being seen from the outside.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
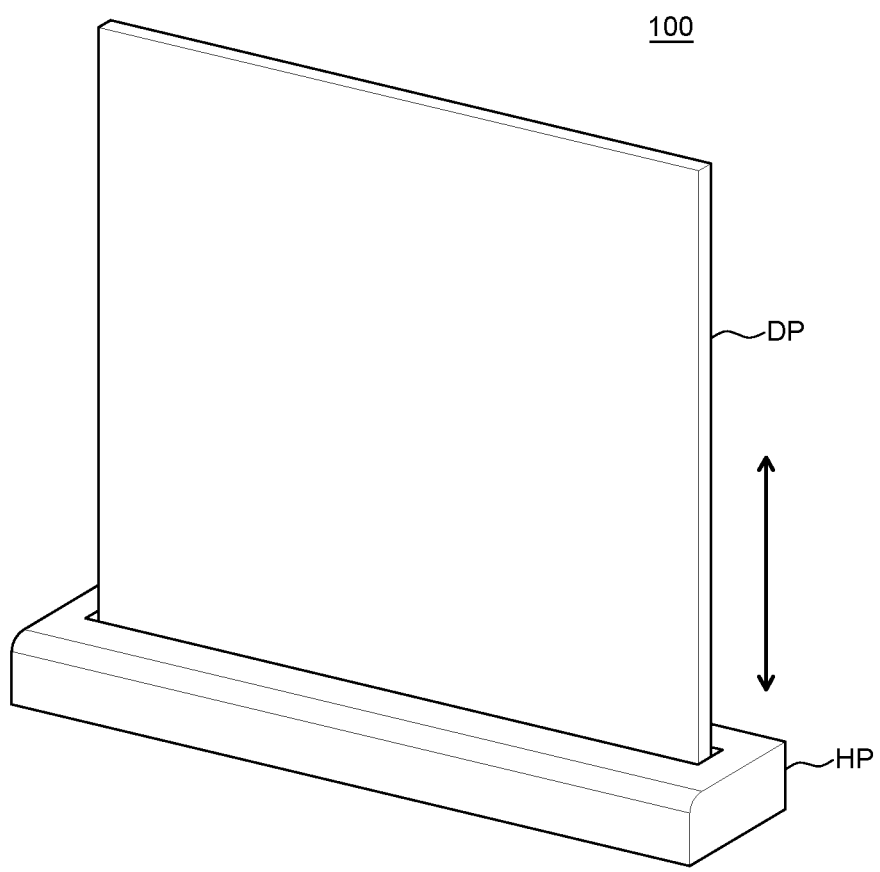
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

<Display Device—Rollable Display Device>

A rollable display device may also be referred to as a display device which is capable of displaying images even though the display device is rolled. The rollable display device may have a high flexibility as compared with a general display device of the related art. Depending on whether to use a rollable display device, a shape of the rollable display device may be freely varied. Specifically, when the rollable display device is not used, the rollable display device is rolled to be stored with a reduced volume. In contrast, when the rollable display device is used, the rolled rollable display device is unrolled to be used.

Figure 1B:
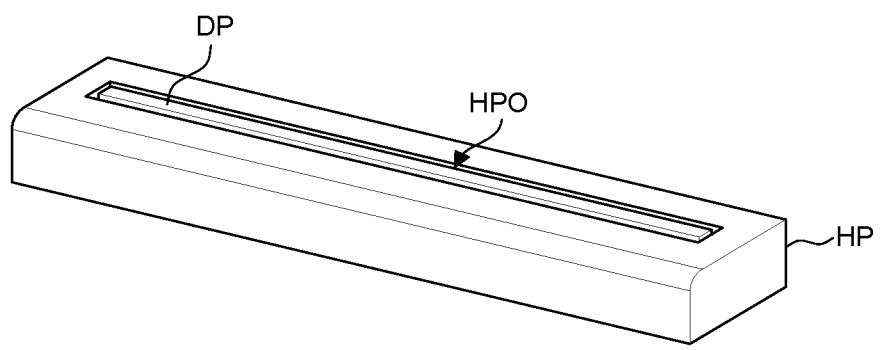

FIGS. 1A and 1B are perspective views of a display device according to an exemplary embodiment of the present disclosure.

Referring to FIGS. 1A and 1B, a display device 100 according to an exemplary embodiment of the present disclosure includes a display part DP and a housing part HP.

The display part DP is an element for displaying images to a user. For example, a display element, circuitry for driving the display element, lines and components may be disposed in the display part DP. As the display device 100 according to the exemplary embodiment of the present disclosure is a rollable display device, the display part DP can be wound and unwound. For example, the display part DP may include a display panel and a mid cover having flexibility to allow winding or unwinding. The display part DP will be described in detail later with reference to FIGS. 3A to 4B.

The housing part HP is a case in which the display part DP can be accommodated. The display part DP may be wound and accommodated inside the housing part HP, and the display part DP may be unwound and disposed outside the housing part HP.

The housing part HP has an opening HPO (shown in FIG. 1B) of the housing part so that the display part DP can move inside and outside the housing part HP. The display part DP may move in the vertical direction through the opening HPO of the housing part.

The display part DP of the display device 100 may be switched between a fully unwounded state and a fully wound state.

FIG. 1A shows the fully unwound state of the display part DP of the display device 100, in which the display part DP of the display device 100 is disposed outside the housing part HP. That is to say, in order for a user to watch images on the display device 100, the display part DP is fully unwound until it can no longer be unwound and disposed outside the housing part HP.

FIG. 1B shows the fully wound state of the display part DP of the display device 100, in which the display part DP of the display device 100 is disposed inside the housing part HP. That is to say, when the user does not watch images on the display device 100, it is advantageous in terms of appearance that the display part DP is not disposed outside the housing part HP. Therefore, the display part DP is wound and is accommodated inside the housing part HP, which may be defined as the fully wound state. In addition, when the display part DP is in the fully wound state, the volume of the display device 100 can be reduced and thus it is easier to carry.

A driver is disposed for winding or unwinding the display part DP to switch between the fully unwound state and the fully wound state.

<Driver>

Figure 2:
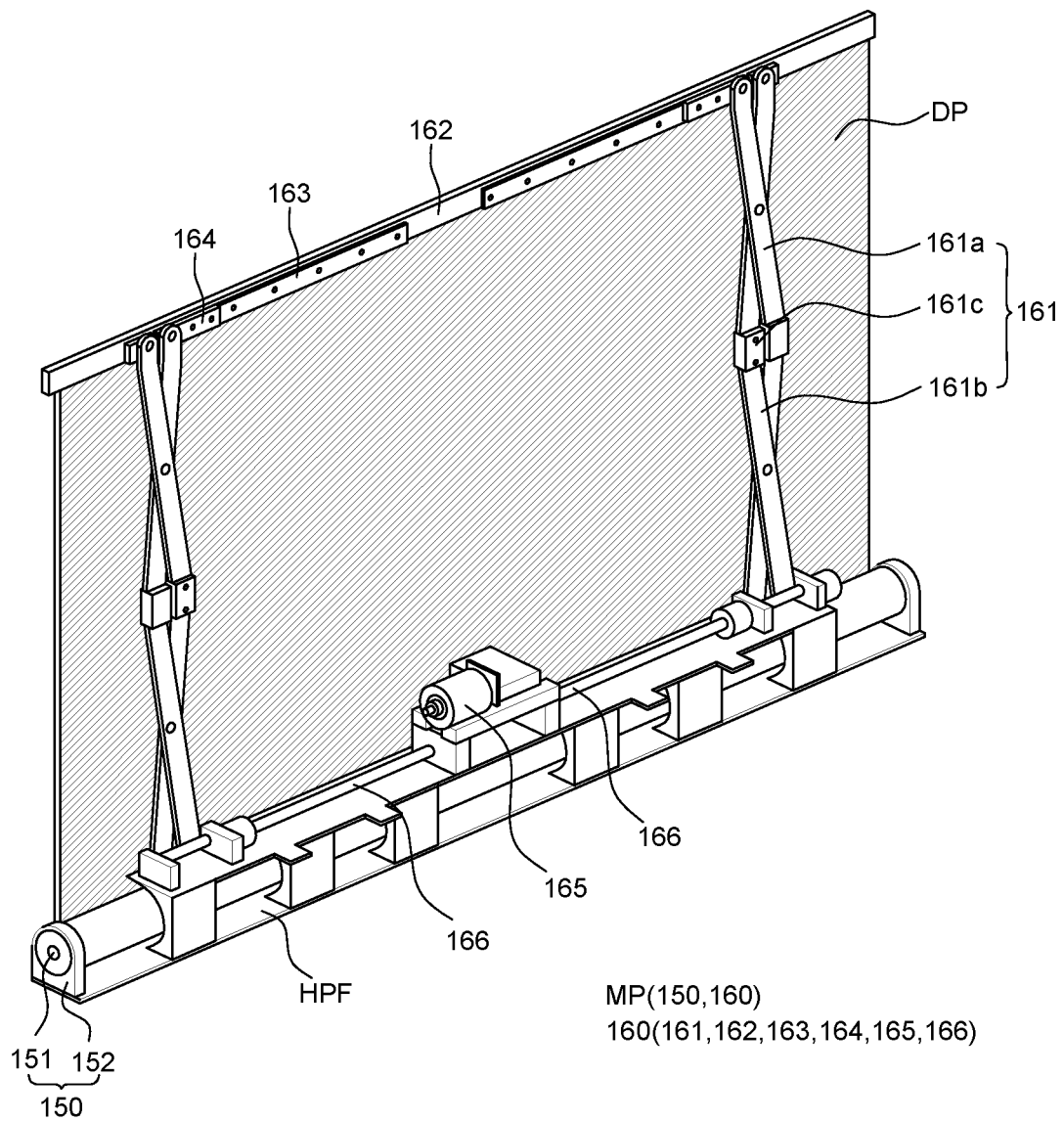
FIG. 2 is a perspective view of a display device according to an exemplary embodiment of the present disclosure.

FIG. 2 is a perspective view of a display device according to an exemplary embodiment of the present disclosure.

First, referring to FIG. 2, the driver MP includes a roller unit 150 and an elevation mechanism 160.

The roller unit 150 rotates clockwise or counterclockwise while the display part DP fixed to the roller unit 150 is wound around or unwound from it. The roller unit 150 includes a roller 151 and roller supports 152.

The roller 151 is a member around which the display part DP is wound. The roller 151 may be formed in a cylindrical shape, for example. The lower edge of the display part DP may be fixed to the roller 151. When the roller 151 rotates, the display part DP having its lower edge fixed to the roller 151 may be wound around the roller 151. When the roller 151 rotates in the opposite direction, the display part DP wound around the roller 151 may be unwound from the roller 151.

Referring to FIG. 2, the roller 151 may be formed in a cylindrical shape. At least a part of the outer circumferential surface of the cylindrical shape may be formed as a flat surface, and the rest part of the outer circumferential surface of the cylindrical shape may be formed as a curved surface. The roller 151 may be formed generally in a cylindrical shape, with a part of it formed as a flat surface. That is to say, a part of the outer circumferential surface of the roller 151 may be formed as a flat surface, and the rest part of the outer circumferential surface thereof may be formed as a curved surface. A plurality of flexible films and printed circuit boards of the display part DP may be seated on the flat surface of the roller 151. It is, however, to be noted that the roller 151 may be formed in a complete cylindrical shape or in any shape as long as the display part DP can be wound around it.

Referring back to FIG. 2, the roller supports 152 support the roller 151 on both sides of the roller 151. Specifically, the roller support 152 is disposed on the floor HPF of the housing part. The upper ends of the roller supports 152 are coupled with both ends of the roller 151, respectively. Thus, the roller supports 152 may support the roller 151 so that it is spaced from the floor HPF of the housing part. The roller 151 may be coupled to the roller supports 152 so that it can rotate.

The elevation mechanism 160 moves the display part DP in the vertical direction in accordance with the driving of the roller unit 150. The elevation mechanism 160 includes link units 161, a head bar 162, slide rails 163, sliders 164, a motor 165, and rotors 166.

Each of the link units 161 of the elevation mechanism 160 includes a plurality of links 161a and 161b and a hinge 161c connecting between the links 161a and 161b. Specifically, for example, the plurality of link 161a and 161b includes a first link 161a and a second link 161b, and the first link 161a and the second link 161b cross each other in a scissor shape and are rotatably engaged via the hinge 161c. Accordingly, when the link unit 161 moves in the vertical direction, the links 161a and 161b may rotate in a direction that is moved away from or closer to each other.

The head bar 162 of the elevation mechanism 160 is fixed to the top end of the display part DP. The head bar 162 may be connected to the link unit 161 and may move the display part DP in the vertical direction according to the rotation of the plurality of links 161a and 161b of the link unit 161. In other words, the display part DP may be moved in the vertical direction by the head bar 162 and the link unit 161.

The head bar 162 covers only a part of the surface adjacent to the top edge of the display part DP so as not to hide the images displayed on front face of the display part DP. The display part DP and the head bar 162 may be fixed with, but is not limited to, screws.

The slide rails 163 of the elevation mechanism 160 provide movement paths of the plurality of links 161a and 161b. A part of the links 161a and 161b is rotatably fastened to the slide rails 163, so that movement can be guided along the trajectory of the slide rails 163. A part of the links 161a and 161b may be fastened to the sliders 164 that is movable along the slide rails 163, so that they can move along the trajectory of the slide rails 163.

The motor 165 may be connected to a power generator such as a separate external power supply or a built-in battery to receive power. The motor 165 generates a rotational force to provide a driving force to the rotors 166.

The rotors 166 are connected to the motor 165 and are configured to convert rotational motion from the motor 165 into linear reciprocating motion. That is to say, the rotational motion of the motor 165 can be converted into a linear reciprocating motion of the structure fixed to the rotors 166. For example, the rotors 166 may be implemented as, but is not limited to, a shaft and a ball screw including a nut fastened to the shaft.

The motor 165 and the rotors 166 may be interlocked with the link units 161 to elevate the display part DP. The link units 161 are formed in a link structure and receive the driving force from the motor 165 and the rotors 166 to repeatedly perform folding or unfolding operations.

Specifically, as the motor 165 is driven, the structure of the rotors 166 may perform a linear motion. That is to say, a part of the rotors 166 to which one end of the second link 161b is connected may perform linear motion. As a result, one end of the second link 161b may move toward the motor 165, and the plurality of links 161a and 161b may be folded, so that the height of the link units 161 may be reduced. In addition, in the course that the links 161a and 161b are folded, the head bar 162 connected to the first link 161a also descends, and one end of the display part DP connected to the head bar 162 also descends.

Accordingly, when the display part DP is fully wound around the roller 151, the link units 161 of the elevation mechanism 160 remains folded. That is to say, when the display part DP is fully wound around the roller 151, the elevation mechanism 160 may have the shortest height. When the display part DP is fully unwound, the link units 161 of the elevation mechanism 160 remains unfolded. That is to say, when the display part DP is fully unwound, the elevation mechanism 160 may have the tallest height.

When the display part DP is wound, the roller 151 may rotate and the display part DP may be wound around the roller 151. For example, the lower edge of the display part DP is connected to the roller 151. When the roller 151 rotates in a first direction, the rear surface of the display part DP is in tight contact with the surface of the roller 151 so that the display part DP can be wound around it.

When the display part DP is unwound, the roller 151 may rotate and the display part DP may be unwound from the roller 151. For example, when the roller 151 rotates in a second direction opposite to the first direction, the display part DP wound around the roller 151 is unwound from the roller 151 and may be disposed outside the housing part HP.

It is, however, to be understood that the present disclosure is not limited thereto. The front surface of the display part DP may be in tight contact with the surface of the roller 151 and may be wound around it.

In some exemplary embodiments, the driver MP having other structure than that of the above-described driver MP may be employed by the display device 100. The configurations of the roller unit 150 and the elevation mechanism 160 may be altered, some of the configurations may be omitted or other configurations may be added, as long as the display part DP can be wound and unwound.

<Display Part>

Figure 3A:
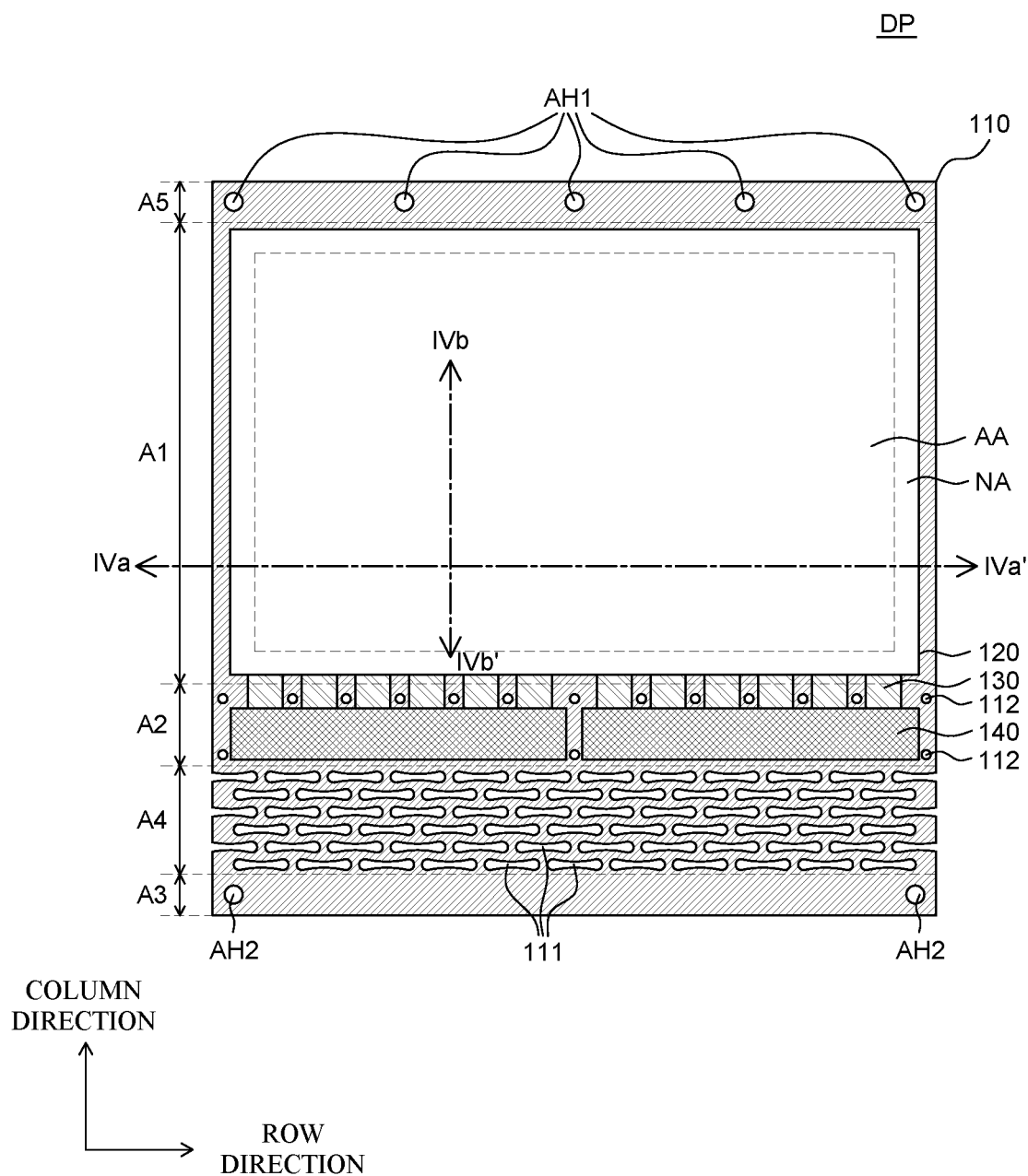
FIG. 3A is a plan view of a display part of a display device according to an exemplary embodiment of the present disclosure.
Figure 3B:
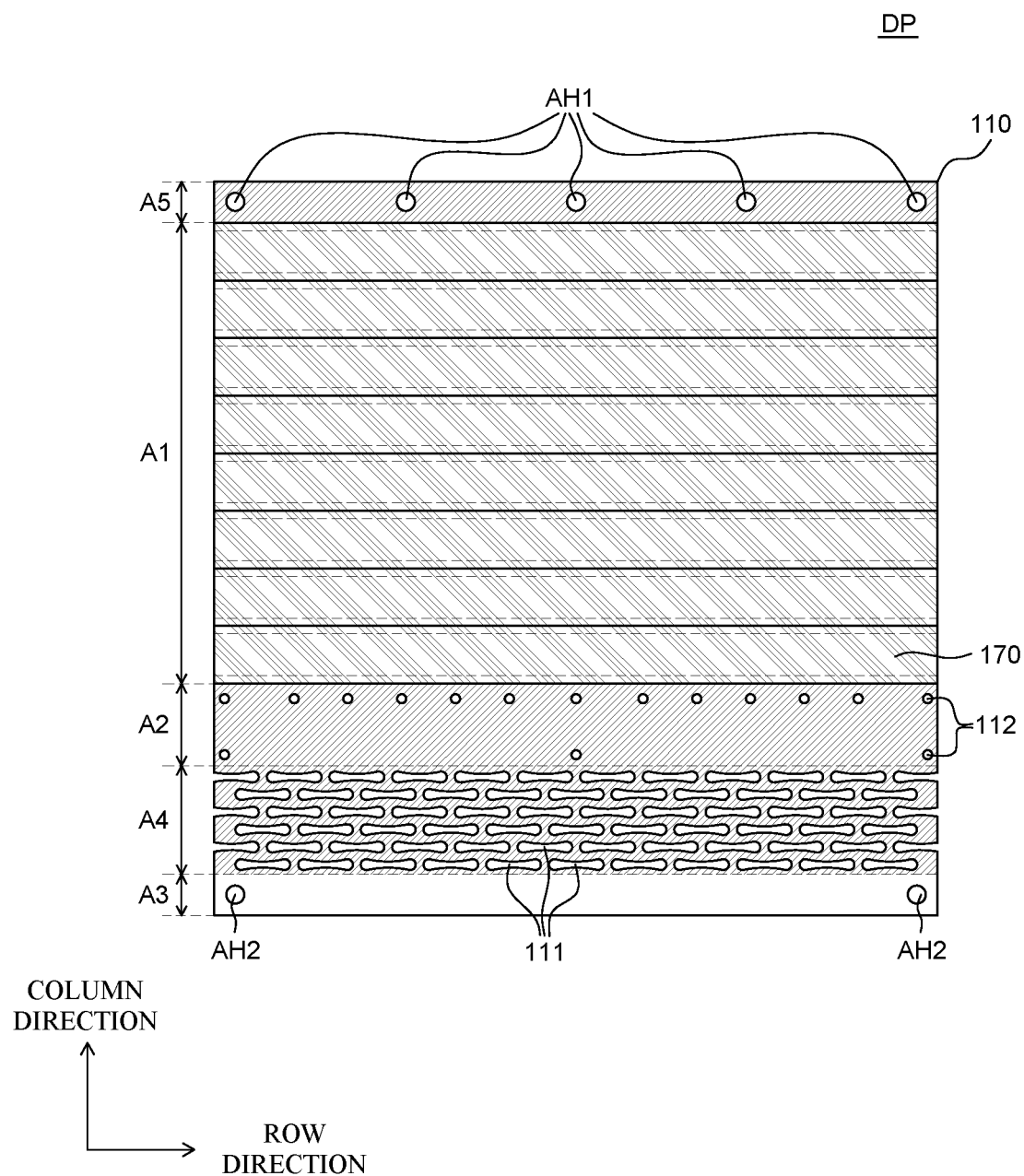
FIG. 3B is a rear view showing a display part of a display device according to an exemplary embodiment of the present disclosure.
Figure 3C:
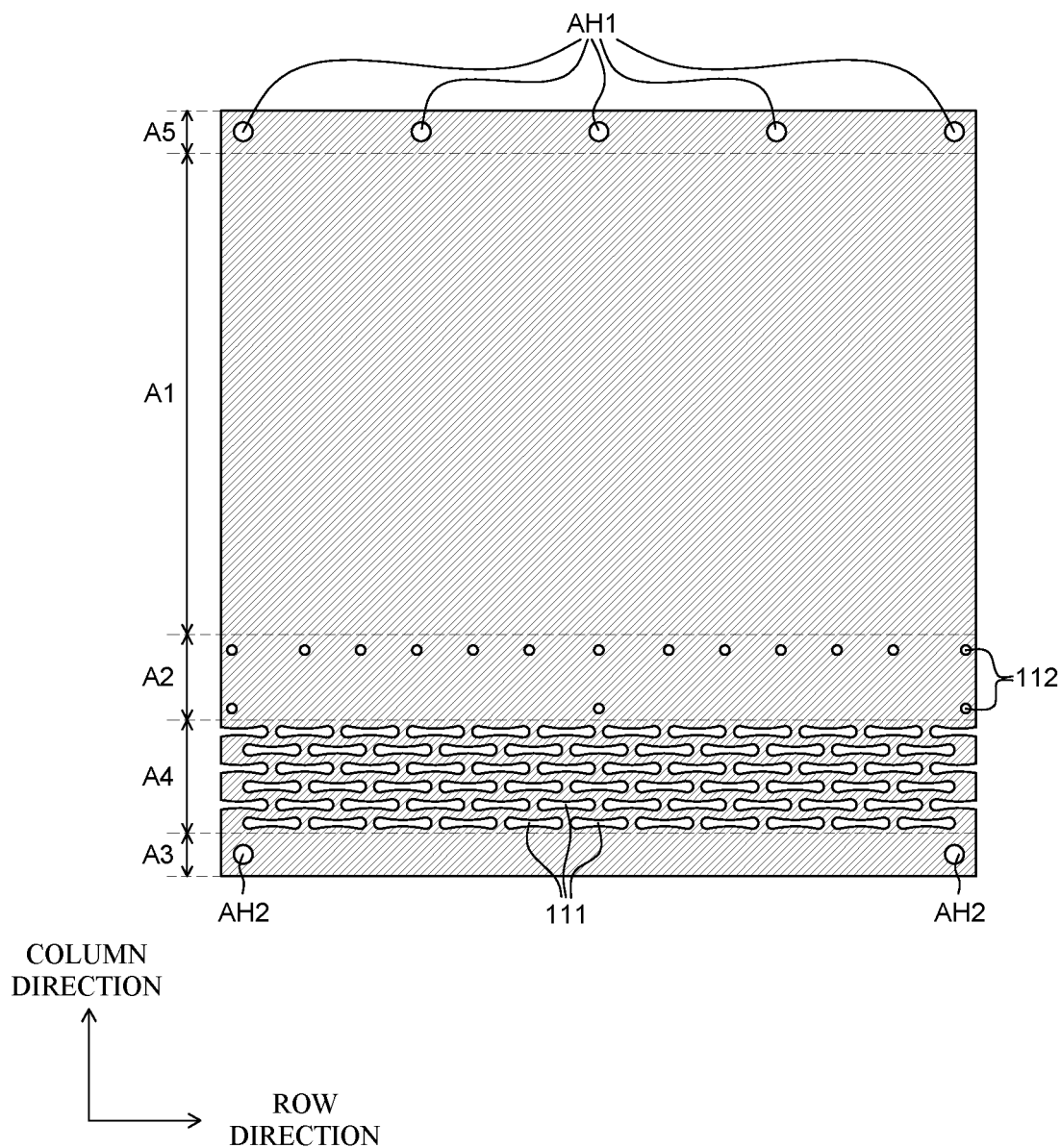
FIG. 3C is a plan view of a mid cover of a display device according to an exemplary embodiment of the present disclosure.
Figure 4A:
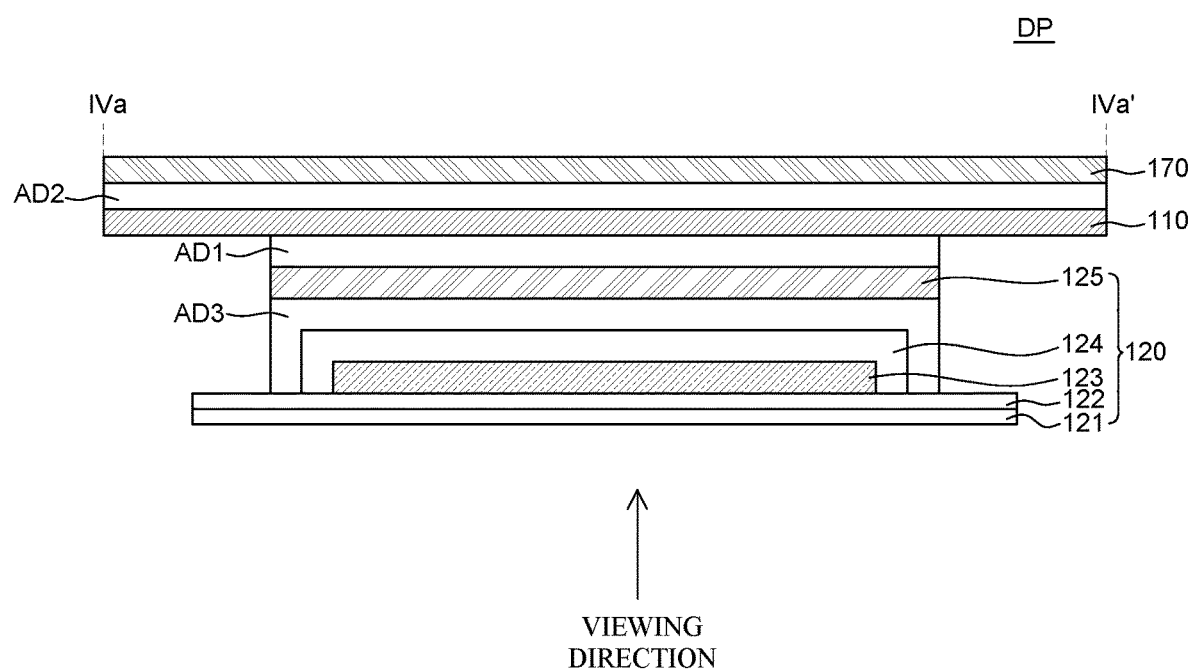
FIG. 4A is a cross-sectional view taken along line IVa-IVa' of FIG. 3A according to an exemplary embodiment of the present disclosure.
Figure 4B:
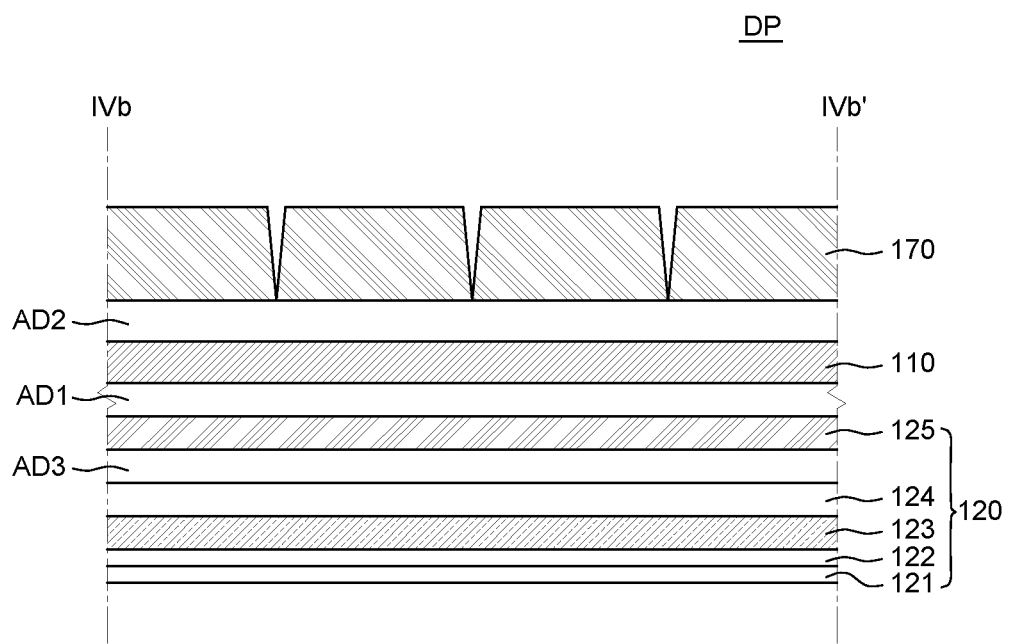
FIG. 4B is an enlarged cross-sectional view taken along line IVb-IVb' of FIG. 3A according to an exemplary embodiment of the present disclosure.

FIG. 3A is a plan view of a display part of a display device according to an exemplary embodiment of the present disclosure. FIG. 3B is a rear view showing a display part of a display device according to an exemplary embodiment of the present disclosure. FIG. 3C is a plan view of a mid cover of a display device according to an exemplary embodiment of the present disclosure. FIG. 4A is a cross-sectional view taken along line IVa-IVa' of FIG. 3A. FIG. 4B is an enlarged cross-sectional view taken along line IVb-IVb' of FIG. 3A. Referring to FIGS. 3A to 4B, the display part DP of the display device 100 includes a mid cover 110, a display panel 120, flexible films 130, printed circuit boards 140, and a plurality of back bars 170.

Referring to FIGS. 3A to 4B, the mid cover 110 is disposed on the rear surface of the display panel 120 to support the rear surfaces of the display panel 120, the flexible films 130 and the printed circuit boards 140. When the display part DP is disposed outside the housing part HP, the mid cover 110 may have a size larger than the sizes of other elements of the display part DP, especially the display panel 120 so that it can protect the display panel 120 from an external impact. For example, the width of the mid cover 100 in the horizontal direction is larger than the width of the display panel 120 in the horizontal direction, so that the mid cover 110 can protect the display part DP when it is disposed outside the housing part HP.

The mid cover 110 is made of a material having flexibility so that deformation does not occur in the mid cover 110 even if the display part DP repeatedly performs winding and unwinding. Specifically, the mid cover 110 is made of a material having a yield stress that is larger than the stress applied to the mid cover 110 when the display part DP is wound. For example, the mid cover 110 may be made of a material such as metal, rubber, plastic and fabric. It is to be noted that the material of the mid cover 110 may be changed as long as the material satisfies the physical property conditions such as the amount of thermal deformation, the radius of curvature and the strength depending on the design choice.

The mid cover 110 has a thin thickness so that deformation does not occur in the mid cover 110 even if the display part DP repeatedly performs winding and unwinding. The mid cover 110 may have, but is not limited to, a thickness of approximately 0.1 mm or less.

The mid cover 110 includes a first area A1, a second area A2, a third area A3, a fourth area A4, and a fifth area A5. Specifically, the fifth area A5, the first area A1, the second area A2, the fourth area A4 and the third area A3 are arranged in this order from the top of the mid cover 110. In the first area A1, the display panel 120 is disposed. In the second area A2, the printed circuit boards 140 electrically connected to the display panel 120 is disposed. The third area A3 is fixed to the roller 151. The fourth area A4 is disposed between the second area A2 and the third area A3. The fifth area A5 is disposed at the top of the mid cover 110.

The fifth area A5 of the mid cover 110 is the uppermost area of the mid cover 110 and is fastened to the head bar 162. First fastening holes AH1 are formed in the fifth area A5 for fastening with the head bar 162. As described above with reference to FIG. 2, the screws penetrating the head bar 162 and the first fastening holes AH1 are disposed, so that the head bar 162 can be fastened to the fifth area A5 of the mid cover 110. As the fifth area A5 is fastened to the head bar 162, when the link units 161 fastened to the head bar 162 are elevated or lowered, the mid cover 110 may also be elevated or lowered together. In addition, the display panel 120 attached to the mid cover 110 may also be elevated or lowered together. Although the five first fastening holes AH1 are shown in FIGS. 3A to 3C, the number of the first fastening holes AH1 is not limited to five. In addition, although the mid cover 110 is fastened to the head bar 162 using the first fastening holes AH1 in the example shown in FIGS. 3A to 3C, the present disclosure is not limited thereto. The mid cover 110 and the head bar 162 may be fastened without a separate fastening hole.

The third area A3 of the mid cover 110 is the lowermost area of the mid cover 110 and is fixed to the roller 151. Second fastening holes AH2 may be formed in the third area A3 for fastening with the roller 151. For example, the screws penetrating the roller 151 and the second fastening holes AH2 are disposed, so that the roller 151 and the third area A3 of the mid cover 110 can be fastened. In addition, as the third area A3 is fastened to the roller 151, the mid cover 110 may be wound around or unwound from the roller 151 by rotation of the roller 151. Although the two second fastening holes AH2 are shown in FIGS. 3A to 3C, the number of the second fastening holes AH2 is not limited to two.

The second area A2 of the mid cover 110 is disposed between the fifth area A5 and the third area A3. The flexible films 130 and the printed circuit boards 140 connected to one end of the display panel 120 are disposed and fixed in the second area A2.

In order to protect the flexible films 130 and the printed circuit boards 140, the second area A2 may allow the flexible films 130 and the printed circuit board 140 to be wound around the roller 151 as a flat surface instead of a curved surface. In addition, a part of the roller 151 that falls in the second area A2 may also be formed as a flat surface.

A plurality of fixing holes 112 is disposed in the second area A2. The plurality of fixing holes 112 may be located between every two of the flexible films 130, so that a base plate and a top cover may be fastened on and under the flexible films 130 and the printed circuit board 140, respectively, by plurality of fixing holes 112. In this manner, the flexible films 130 and the printed circuit boards 140 can be more stably fixed. The number of the plurality of fixing holes 112 shown in FIGS. 3A to 3C is merely illustrative. The number of the plurality of fixing holes 112 may be determined based on the number of the printed circuit boards 140 and the number of the flexible films 130.

The fourth area A4 of the mid cover 110 is extended so that the display area AA of the display panel 120 can be disposed outside the housing part HP. The fourth area A4 is extended from the second area A2 to the third area A3. For example, when the mid cover 110 and the display panel 120 are fully unwound, the third area A3 of the mid cover 110 fixed to the roller 151 and the second area A2 where the flexible film 130 and the printed circuit boards 140 are attached may be disposed inside the housing part HP, whereas the first area A1 and the fifth area A5 having the display panel 120 attached thereto may be disposed outside the housing part HP. If the length from the third area A3 fixed to the roller 151 to the second area A2 is smaller than the length from the third area A3 to the opening HPO of the housing part, a part of the first area A1 having the display panel 120 attached thereto may be disposed inside the housing part HP. Therefore, since a part of the lower end of the display area AA of the display panel 120 is disposed inside the housing part HP, it may be difficult to watch images. Therefore, the display device may be designed so that the length from the third area A3 fixed to the roller 151 to the second area A2 is equal to the length from the third area A3 fixed to the roller 151 to the opening HPO of the housing part.

A plurality of openings 111 is disposed in the fourth area A4. When the display part DP is wound or unwound, stress may be applied to the display part DP. When this happens, in the display device 100 according to an exemplary embodiment of the present disclosure, even if stress is applied to the display part DP while the display part DP is wound or unwound, the plurality of openings 111 of the mid cover 110 can be deformed flexibly so that the stress applied to the mid cover 110 can be relieved. Specifically, when the display part DP is wound or unwound, the fourth area A4 of the mid cover 110 may be deformed as the openings 111 contract or expand. Accordingly, stress applied to the mid cover 110 can be reduced.

The first area A1 of the mid cover 110 is disposed between the fifth area A5 and the second area A2. Specifically, the first area A1 is wound around or unwound from the roller 151 together with the display panel 120 and the plurality of back bars 170. The first area A1 may overlap at least the display panel 120 among the other elements of the display part DP.

The display panel 120 is a panel for displaying images to a user. In the display panel 120, a display element for displaying images, a driving element for driving the display element, lines for transmitting various signals to the display element and the driving element, etc. may be disposed.

The display element may be defined differently depending on the type of the display panel 120. For example, when the display panel 120 is an organic light-emitting display panel, the display element may be an organic light-emitting element that includes an anode, an organic emissive layer, and a cathode. For example, when the display panel 120 is a liquid-crystal display panel, the display element may be a liquid-crystal display element. In addition, when the display panel 120 is a light-emitting display panel including LEDs, the display element may be an LED. In the following description, the display panel 120 is described as an organic light-emitting display panel. It is, however, to be understood that the display panel 120 is not limited to the organic light-emitting display panel. As the display device 100 according to the exemplary embodiment of the present disclosure is a rollable display device, the display panel 120 may be implemented as a flexible display panel in order to be wound around or unwound from the roller 151.

Referring to FIG. 3A, the display panel 120 includes a display area AA and a non-display area NA.

In the display area AA, images are displayed on the display panel 120. A plurality of pixels may be defined in the display area AA, and a plurality of sub-pixels forming each of the pixels and driver circuits for driving the plurality of sub-pixels may be disposed in the display area AA. The plurality of sub-pixels is the minimum units forming the display area AA. A display element may be disposed in each of the plurality of sub-pixels. For example, an organic light-emitting element including an anode, an organic light-emitting layer, and a cathode may be disposed in each of the plurality of sub pixels. It is, however, to be understood that the present disclosure is not limited thereto. In addition, driving elements, lines etc. may be included in the circuitry for driving a plurality of sub-pixels. For example, the circuitry may be formed of, but is not limited to, thin-film transistors, storage capacitors, gate lines, data lines, etc.

In the non-display area NA, no image is displayed. The non-display area NA surrounds the display area AA. In the non-display area NA, a variety of lines and circuits for driving the organic light-emitting elements in the display area AA, etc. may be disposed. For example, in the non-display area NA, link lines for transmitting signals to a plurality of sub-pixels and circuits of the display area AA, or driver ICs such as a gate driver and a data driver may be disposed. It is, however, to be understood that the present disclosure is not limited thereto.

More specifically, driver circuits such as the gate driver for driving the display area AA and a variety of signal lines connected to the driver circuits may be disposed in at least one of the non-display areas NA on both sides of the display area AA. The gate driver may be embedded in the non-display area NA on at least one side of the both sides of the display area AA by using the gate-in-panel (GIP) technology. That is to say, the gate driver may be disposed on either side of the display area AA, or may be disposed on at least one of the both sides of the display area AA.

The flexible film 130 is formed by disposing various elements on a flexible base film. The flexible film 130 may supply signals to a plurality of sub-pixels and circuits in the display area AA and may be electrically connected to the display panel 120. The flexible film 130 is disposed at one end of the non-display area NA of the display panel 120 to supply voltage, data voltage, etc. to the plurality of sub-pixels and circuits in the display area AA. The number of flexible films 130 shown in FIG. 3A is merely illustrative, and the number of flexible films 130 may be changed depending on the design choice.

Driver ICs such as a gate driver IC and a data driver IC may also be disposed on the flexible films 130, for example. The driver ICs are elements for processing data for displaying images and processing signals for processing the data. The driver ICs may be disposed by using the chip-on-glass (COG) technique, the chip-on-film (COF) technique, tape carrier package (TCP) technique, etc. In the following description, the driver ICs are mounted on the flexible films 130 by using the chip-on-film (COF) technique for convenience of illustration. It is, however, to be understood that the present disclosure is not limited thereto.

Referring to FIG. 3A, the printed circuit boards 140 are disposed at one end of the flexible films 130 to be connected to the flexible films 130. The printed circuit boards 140 supply signals to the driver ICs. The printed circuit board 140 supplies various signals, such as driving signals and data signals, to the driver ICs. A variety of elements may be disposed on the printed circuit boards 140. For example, a timing controller, a power source, etc. may be disposed on the printed circuit boards 140. Although two printed circuit boards 140 are shown in FIG. 3A, the number of the printed circuit boards 140 is not limited to two but may be variously changed depending on the design choice.

Although not shown in FIG. 3A, an additional printed circuit board connected to the printed circuit boards 140 may be further disposed. For example, the printed circuit boards 140 may be referred to as source printed circuit boards (S-PCB) on which the data driver is mounted, and an additional printed circuit board connected to the printed circuit boards 140 may be referred to as a control printed circuit board (C-PCB) on which the timing controller and the like are mounted. The additional printed circuit board may be disposed inside the roller 151 or may be disposed in the housing part HP outside the roller 151.

Referring to FIG. 3B, a plurality of back bars 170 are disposed under the mid cover 110 to support the mid cover 110 and the display panel 120. Specifically, the plurality of back bars 170 are disposed on the surface of the mid cover 110 that is opposite to the surface on which the display panel 120 is disposed. The plurality of back bars 170 are disposed in the first area A1. That is to say, the plurality of back bars 170 are disposed in the first area A1 overlapping the display panel 120.

The plurality of back bars 170 have a longer axis in the row direction and a shorter axis in the column direction. On the rear surface of the mid cover 110, One back bar 170 extended in the row direction is disposed in every row, and a plurality of back bars 170 are arranged in the column direction. The width of the plurality of back bars 170 is equal to or greater than the width of the mid cover 110 in the horizontal direction. The edges of the plurality of back bars 170 are disposed more to the outside than the edges of the display panel 120. Accordingly, when the display part DP is disposed outside the housing part HP, it is possible to protect the other elements of the display part DP, especially the display panel 120 from outside impact. The thickness of the plurality of back bars 170 may be larger than the thickness of the mid cover 110. The thickness of the plurality of back bars 170 may be defined as the distance between the upper surface and the lower surface facing the upper surface of the mid cover 110. The thickness of the plurality of back bars 170 may be equal to or less than 2 mm.

The plurality of back bars 170 is made of a material having strength. For example, the plurality of back bars 170 may be made of a metal material such as steel use stainless (SUS) and Invar, or a material such as plastic. It is to be noted that the material of the mid cover 110 may be changed as long as the material satisfies the physical property conditions such as the amount of thermal deformation, the radius of curvature and the strength depending on the design choice.

The plurality of back bars 170 may have a trapezoidal cross-sectional shape. Accordingly, adjacent ones of the back bars 170 are spaced apart from one another by a predetermined angle. Accordingly, when the display part DP is wound, the angle between the back bars 170 may be adjusted so that the display panel 120 is wound. Specifically, the back bars 170 are bent in the column direction by the angle formed between adjacent ones of the back bars 170. It is to be noted that the cross-sectional shape of the plurality of back bars 170 is not limited thereto, and may be various shapes such as a triangular shape.

The plurality of back bars 170 are disposed on the rear surface of the display part to support the display part DP. For example, when the display part DP is wound, the plurality of back bars 170 may be bent along the outer surface of the roller 151 so that the display panel 120 may be wound around the roller 151. In the fully unwound state where the display part DP of the display device 100 is disposed outside the housing part HP, the plurality of back bars 170 are unfolded in a flat shape outside the housing part HP so that the display part DP remains flat. Accordingly, it is possible to reduce the deformation and wrinkles which may occur in the display panel 120 as it is wound and unwound repeatedly, thereby improving the flatness of the display panel 120.

Referring to FIGS. 4A and 4B, the display panel 120 includes a substrate 121, a buffer layer 122, a pixel portion 123, an encapsulation layer 124, and an encapsulation substrate 125.

The substrate 121 is a base member for supporting various elements of the display panel 120 and may be made of an insulating material. The substrate 121 may be made of a material having flexibility so that the display panel 120 can be wound or unwound, and may be made of a plastic material such as polyimide (PI), for example.

The buffer layer 122 can reduce diffusion of moisture and/or oxygen that has permeated from the outside of the substrate 121. The buffer layer 122 may be made up of, but is not limited to, a single layer or a plurality of layers of silicon oxide (SiOx) and silicon nitride (SiNx).

The pixel portion 123 is an element in which a plurality of pixels is disposed, and includes an organic light-emitting element and a circuit for driving the organic light-emitting element. The pixel portion 123 may correspond to the display area AA. The organic light-emitting element may include an anode, an organic light-emitting layer and a cathode.

The anode may supply holes to the organic light-emitting layer, and may be made of a conductive material having a high work function. For example, the anode may be made of, but is not limited to, tin oxide (TO), indium tin oxide (ITO), indium zinc oxide (IZO), indium tin zinc oxide (ITZO), etc.

The organic light-emitting layer may receive holes from the anode and receive electrons from the cathode to emit light. The organic light-emitting layer may be a red organic light-emitting layer, a green organic light-emitting layer, a blue organic light-emitting layer, and a white organic light-emitting layer depending on the color of light emitted from the organic light-emitting layer. When the organic light-emitting layer is a white organic light-emitting layer, color filters of various colors may be additionally disposed.

The cathode may supply electrons to the organic light-emitting layer, and may be made of a conductive material having a low work function. For example, the cathode may be made of, but is not limited to, at least one selected from metals such as magnesium (Mg), silver (Ag) and aluminum (Al), and alloys thereof.

The display panel 120 may be either a top-emission display panel or a bottom-emission display panel depending on the direction in which light emitted from the organic light-emitting element exits.

In the top-emission display panel, the light emitted from the organic light-emitting element exits toward the upper side of the substrate SUB 21 where the organic light-emitting element is formed. When the display panel 120 is the top-emission display panel, a reflective layer may be formed on under the anode to propagate the light emitted from the organic light-emitting element toward the upper side of the substrate 121, i.e., the cathode side.

In the bottom-emission display panel, the light emitted from the organic light-emitting element exits toward the lower side of the substrate SUB 21 where the organic light-emitting element is formed. In the bottom-emission display panel, in order to propagate the light emitted from the organic light-emitting element toward the lower side of the substrate SUB 121, the anode may be made only of a transparent conductive material, and the cathode may be made of a metal material having high reflectivity.

In the following description, for convenience of illustration, the display device 100 according to the exemplary embodiment of the present disclosure is a bottom-emission display device. It is, however, to be understood that the present disclosure is not limited thereto.

A circuit for driving the organic light-emitting element is disposed in the pixel portion 123. The circuit may be formed of a thin-film transistor, a storage capacitor, a gate line, a data line, a power line, etc., but may be variously changed depending on the design of the display device 100.

The encapsulation layer 124 is on the pixel portion 123 to cover it. The encapsulation layer 124 seals the organic light-emitting element of the pixel portion 123. The encapsulation layer 124 can protect the organic light-emitting element of the pixel portion 123 from the outside moisture, oxygen, impact, etc. The encapsulation layer 124 may be formed by alternately stacking a plurality of inorganic layers and a plurality of organic layers. For example, the inorganic layers may be made of an inorganic material such as silicon nitride (SiNx), silicon oxide (SiOx) and aluminum oxide (AlOx). The organic layer may be made of an epoxy-based or acrylic-based polymer. It is, however, to be understood that the present disclosure is not limited thereto.

The encapsulation substrate 125 is disposed on the encapsulation layer 124. The encapsulation substrate 125 protects the organic light-emitting element of the pixel portion 123 together with the encapsulation layer 124. The encapsulation substrate 125 can protect the organic light-emitting element of the pixel portion 123 from the outside moisture, oxygen, impact, etc. The encapsulation substrate 125 may be made of a metal material such as aluminum (Al), nickel (Ni), chromium (Cr), an alloy material of iron (Fe) and nickel, etc., which is resistant to corrosion and is easy to process into a foil or thin film. As the encapsulation substrate 125 is made of such a metal material, the ultra-thin encapsulation substrate 125 can be implemented, which is resistant to the outside impact, scratches.

A third adhesive layer AD3 may be disposed between the encapsulation layer 124 and the encapsulation substrate 125. The third adhesive layer AD3 may attach the encapsulation layer 124 and the encapsulation substrate 125 together. The third adhesive layer AD3 may be made of a material having adhesive properties, and may be a thermally-curable or naturally-curable adhesive. For example, the third adhesive layer AD3 may be made of, but is not limited to, an optical clear adhesive (OCA), a pressure sensitive adhesive (PSA), etc.

The third adhesive layer AD3 may be disposed to surround the encapsulation layer 124 and the pixel portion 123. Specifically, the pixel portion 123 may be sealed by the buffer layer 122 and the encapsulation layer 124, and the encapsulation layer 124 and the pixel portion 123 may be sealed by the buffer layer 122 and the third adhesive layer AD3. The third adhesive layer AD3 can protect the organic light-emitting element of the pixel portion 123 from moisture, oxygen, and impact from outside, along with the encapsulation layer 124 and the encapsulation substrate 125. To this end, the third adhesive layer AD3 may further include a hygroscopic agent. The hygroscopic agent may be hygroscopic particles and can absorb moisture and oxygen from the outside, thereby suppressing the permeation of moisture and oxygen into the pixel portion 123.

The mid cover 110 is disposed on the encapsulation substrate 125. The mid cover 110 may be in contact with the encapsulation substrate 125 of the display panel 120 to protect the display panel 120.

A first adhesive layer AD1 is disposed between the encapsulation substrate 125 and the mid cover 110. The first adhesive layer AD1 is disposed on the upper surface of the mid cover 110 to attach the display panel 120 on which the encapsulation substrate 125 is disposed to the mid cover 110. The first adhesive layer AD1 may be made of a material having adhesive properties, and may be a thermally-curable or naturally-curable adhesive. For example, the first adhesive layer AD1 may be made of, but is not limited to, an optical clear adhesive (OCA), a pressure sensitive adhesive (PSA), etc.

The plurality of back bars 170 are disposed on the mid cover 110. The plurality of back bars 170 may be disposed on the rear surface of the display panel 120 to support the display panel 120.

A second adhesive layer AD2 may be disposed between the mid cover 110 and the plurality of back bars 170. The second adhesive layer AD2 may be disposed on the lower surface of the mid cover 110 to attach the mid cover 110 to the plurality of back bars 170. The second adhesive layer AD2 is made of a material having adhesive properties and is made of a material having elasticity. For example, the second adhesive layer AD2 may be formed of, but is not limited to, a foam pad and an elastic resin.

In an existing rollable display device, a mid cover is disposed on the rear side of a display panel, a flexible film and a printed circuit board to support the display panel, the flexible film, the printed circuit board. As the thickness of display devices is ever reduced, a thin mid cover is used. As a result, the strength of the mid cover is lowered, such that the reliability and flatness of the display part have been lowered.

In addition, in an existing rollable display device, a plurality of back bars is disposed on the rear side of a display panel, a flexible film and a printed circuit board to support the display panel, the flexible film, the printed circuit board. However, there was a problem in that the boundaries of the back bars are seen from the front side of the display panel. To solve such a problem, it was contemplated to employ a thick adhesive layer or a foam pad. However, there was a problem in that the thickness is increased too much so that the rolling characteristics were deteriorated.

In this regard, in the display device 100 according to an exemplary embodiment of the present disclosure, the plurality of back bars 170 is disposed on the rear surface of the mid cover 100, so that the flatness of the display part DP can be improved while the back bars 170 disposed on the rear side of the display panel 120 are not seen. In addition, the side strength can be improved even with the reduced thickness, and thus the reliability of the display device 100 can be improved.

First, the plurality of back bars 170 can improve the flatness of the display panel 120. Previously, a mid cover is implemented as a single piece in the display part to support the shape of the display panel. Such a mid cover has insufficient force to support the display panel and thus there is a problem that deformation and wrinkles occur in the display panel as the winding and unwinding are repeated. In this regard, in the display device 100 according to an exemplary embodiment of the present disclosure, the flatness of the display panel 120 can be improved by attaching the plurality of back bars 170 to the rear surface of the mid cover 110. For example, the plurality of back bars 170 have the shorter axis in the column direction to allow the display part DP to be wound and unwound. When the display part DP is unwound, the plurality of back bars 170 pass through the opening HPO of the housing part and unfolded flat outside the housing part HP. The plurality of back bars 170 have the longer axis in the row direction to fix the shape of the display panel 120 in the row direction and to allow the display part DP to remain flat. In this manner, the plurality of back bars 170 fall in a part of the mid cover 110 can improve the issues of the deformation and wrinkles of the display panel 120 which may occur as winding and unwinding repeat.

In addition, in the display device 100 according to an exemplary embodiment of the present disclosure, the mid cover 110 can reduce the boundaries of the back bars 170 from being seen. Specifically, the mid cover 110 having a thickness smaller than the thickness of the plurality of back bars 170 is disposed on one surface of the display panel 120 to reduce the boundaries of the back bars 170 from being seen. Accordingly, the mid cover 110 disposed to impart strength of the display part DP can also prevent the boundaries of the back bars 170 from being seen. As a result, in the display device 100 according to the exemplary embodiment of the present disclosure, the thickness of the second adhesive layer AD2 can be reduced. For example, in an existing back bar structure, a foam pad having the thickness of 0.64 mm is disposed to prevent the boundaries of the back bars from being seen. In contrast, in the display device 100 according to the exemplary embodiment of the present disclosure, the foam pad is used as the second adhesive layer AD2, which has the thickness of 0.15 mm Therefore, the mid cover 110 together with the second adhesive layer AD2 can reduce the boundaries of the plurality of back bars 170 from being seen, and the thickness of the second adhesive layer AD2 disposed to prevent the boundaries of the back bars 170 from being seen can reduce the thickness.

The plurality of back bars 170 may be disposed together with the mid cover 110 to form a thin display part DP. The plurality of back bars 170 are made of a material having strength, and protects the display part DP from a force applied from the outside. Accordingly, the strength of the display part DP is achieved by the plurality of back bars 170. Therefore, it is possible to dispose the mid cover 110 with a reduced thickness compared to the existing display part including the single mid cover. Specifically, the thickness of the mid cover 110 can be reduced by about half compared to when the existing single mid cover is disposed. Previously, a mid cover having a thickness of 0.2 to 0.23 mm was disposed to support a display part, for example. In contrast, in the display device 100 according to the exemplary embodiment of the present disclosure, the mid cover 110 having a thickness of 0.1 mm or less can be disposed. Next, the mid cover can also contribute to increasing the side strength of the display part DP. The mid cover 110 is disposed up to the outside of the display panel DP to impart strength to the display panel 120. As a result, it is possible to reduce the thickness of the back bars 170. Previously, back bars having the thickness of 4 mm was disposed to support a display part, for example. In contrast, in the display device 100 according to the exemplary embodiment of the present disclosure, the back bars 170 having a thickness of 2.5 mm or less can be disposed to achieve the same strength as the existing display part DP.

<Example of Back Bars>

The positions of the back bars 170 change along the outer circumferential surface of the roller 151 when the display part DP is wound around it. Accordingly, when the display part DP is wound, the angle between adjacent ones of the back bars 170 is changed, and the winding characteristics of the display part DP may vary depending on the angle between the back bars 170. The angle formed by the adjacent back bars 170 are related to the length and thickness of the back bars 170 and radius of the roller 151.

Figure 5A:
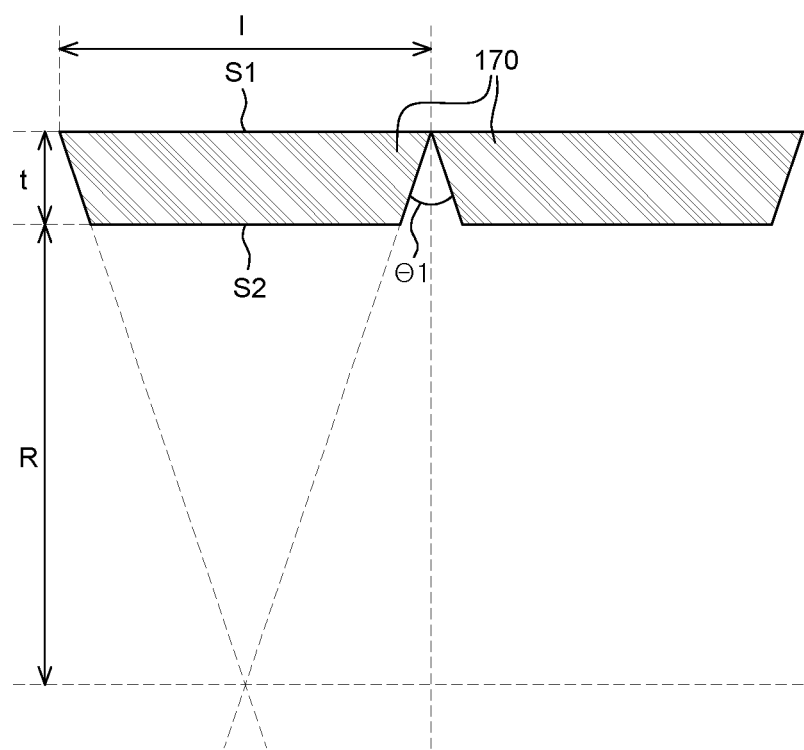
FIGS. 5A and 5B are schematic cross-sectional views of back bars of a display device according to an exemplary embodiment of the present disclosure.
Figure 5B:
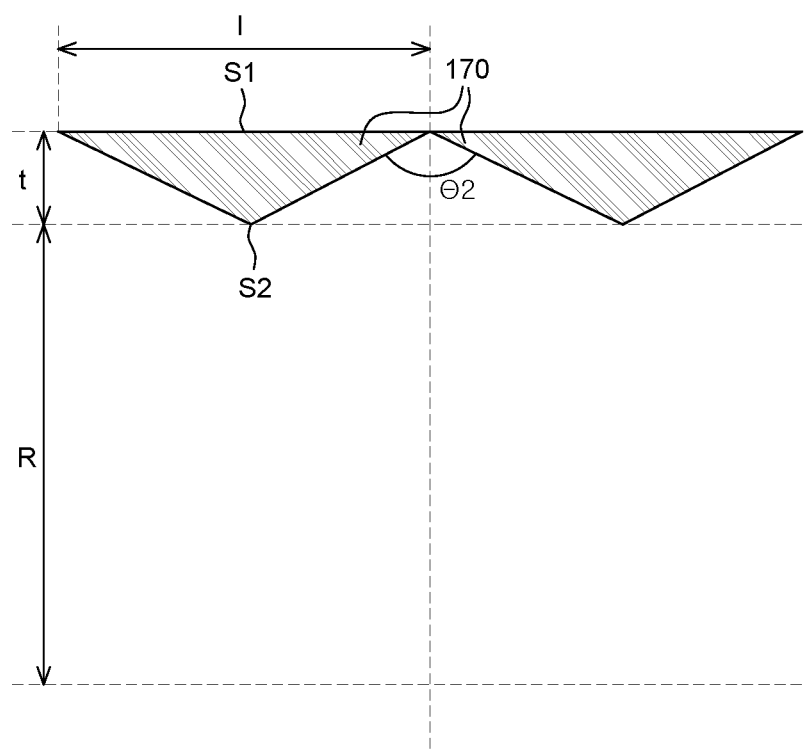

FIGS. 5A and 5B are schematic cross-sectional views showing an exemplary embodiment of the present disclosure. FIGS. 5A and 5B schematically show cross-sectional views of some of the back bars 170 arranged in the column direction. In FIGS. 5A and 5B, R denotes the rolling radius from the center of the roller 151 to the back bars 170, t denotes the thickness of the back bar 170, i.e., the distance between the first surface S1 and the second surface S2 of the back bar 170, and l denotes the length of the back bar in the column direction, i.e., the length in the shorter axis direction of the back bar 170. The angle between adjacent back bars among the plurality of back bars 170 may be equal to $l/(R+t)$ to $2\tan^{-1}\{l/(2(t))\}$. Hereinafter, an angle range between the plurality of back bars 170 will be described with reference to FIGS. 5A and 5B.

First, the minimum angle between the plurality of back bars 170 may be equal to $l/(R+t)$. Referring to FIG. 5A, the minimum angle between the plurality of back bars 170 will be described. The cross section of the back bar 170 is trapezoidal. Each of the back bars 170 includes a first surface S1 and a second surface S2 facing the first surface S1. The first surface S1 is closer to the mid cover 110, while the second surface S2 is disposed at the bottom of the display part DP. The second surface S2 is smaller than the first surface S1. The edge of the first surface S1 of one back bar 170 may be in contact with the edge of the first surface S1 of another back bar 170 adjacent thereto. Since the second surface S2 is smaller than the first surface S1, the second surface S2 of one back bar 170 may be spaced apart from the second surface S2 of another back bar 170 adjacent thereto. When the display part DP is wound, the edge of a second surface S2 may be in contact with the edge of another second surface S2, and a back bar 170 may move as much as the angle between the back bar 170 and another adjacent back bar 170. The minimum $\Theta 1$ may be equal to $l/(R+t)$, where $\Theta$ denotes the angle between adjacent back bars 170. The value of $\Theta 1$ can be obtained by using the formula to find the length of the arc of a fan. The plurality of back bars 170 are in contact with the roller 151 when the display part is wound. Accordingly, they may be in contact with the roller 151 at the boundary surface with adjacent back bars. In order for the back bars 170 to be in contact with the outer circumferential surface of the roller 151, the value of l may be small. Considering that $\Theta 1$ is the minimum angle, the value of l may be equal to the length of an arc having the radius of $(r+t)$ and the center angle $\Theta$. Accordingly, the size l of the circumference may be equal to $\theta 1*(R+t)$, and $\theta 1$ may be equal to $l/(R+t)$. Therefore, the minimum angle $\theta 1$ between the back bars 170 may form $l/(R+t)$.

Next, the maximum angle between the back bars 170 may be equal to $2\tan^{-1}\{l/(2(t))\}$. Referring to FIG. 5B, the maximum angle between the plurality of back bars 170 will be described. The cross section of the back bars 170 is triangular. In order to maximize the angle between one back bar 170 and the adjacent back bar 170, the plurality of back bars 170 may have a triangular cross section. Each of the back bars 170 includes a first surface S1 and a second surface S2 facing the first surface S1. The first surface S1 of each of the back bars 170 is identical to the first surface S1 of FIG. 5A. However, the second surface S2 in FIG. 5B has a pointed shape formed by two lines. Accordingly, the edge of the first surface S1 of one back bar 170 is in contact with the edge of the first surfaces S1 of another back bar 170 adjacent thereto. The lines forming the pointed shape as the second surface S2 are spaced apart from each other. On the other hand, when rolled, the back bars 170 may move so that all of the lines forming the pointed shape as the second surface S2 may be in contact with one another. If the angle between the plurality of back bars 170 is referred to as $\theta$ and the maximum value of $\theta$ is referred to as $\theta 2$, $\theta 2$ may be an angle formed by the back bars 170 having the triangular cross section. If the angle between the adjacent back bars 170 having the triangular cross section is referred to as $\theta 2$, $\theta 2$ is equal to the inner angle of the triangle facing the first surface S1. Therefore, the inner angle of the triangle facing the first surface S1 may be equal to $2\tan^{-1}\{l/(2(t))\}$, and the maximum angle between the back bars 170 may be equal to $2\tan^{-1}\{l/(2(t))\}$. Accordingly, the maximum angle $\theta 2$ between the back bars 170 may form $2\tan^{-1}\{l/(2(t))\}$.

Accordingly, the angle θ between the back bars 170 having the same thickness and length may form the angle of l/(R+t) to 2 tan−1{l/(2(t)}.

<Specific Configuration of Mid Cover>

Figure 6A:
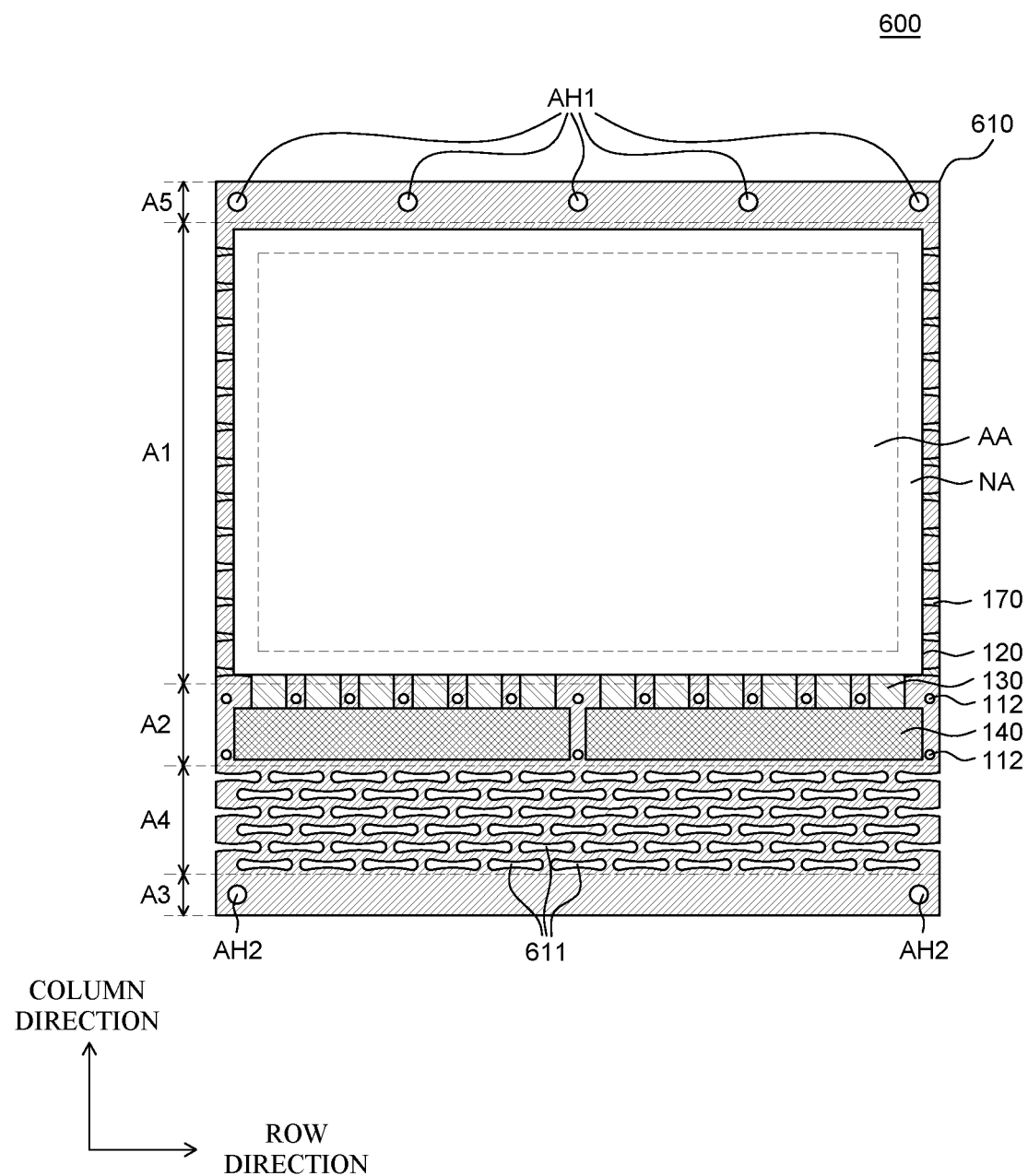
FIG. 6A is a plan view of a display part of a display device according to another exemplary embodiment of the present disclosure.
Figure 6B:
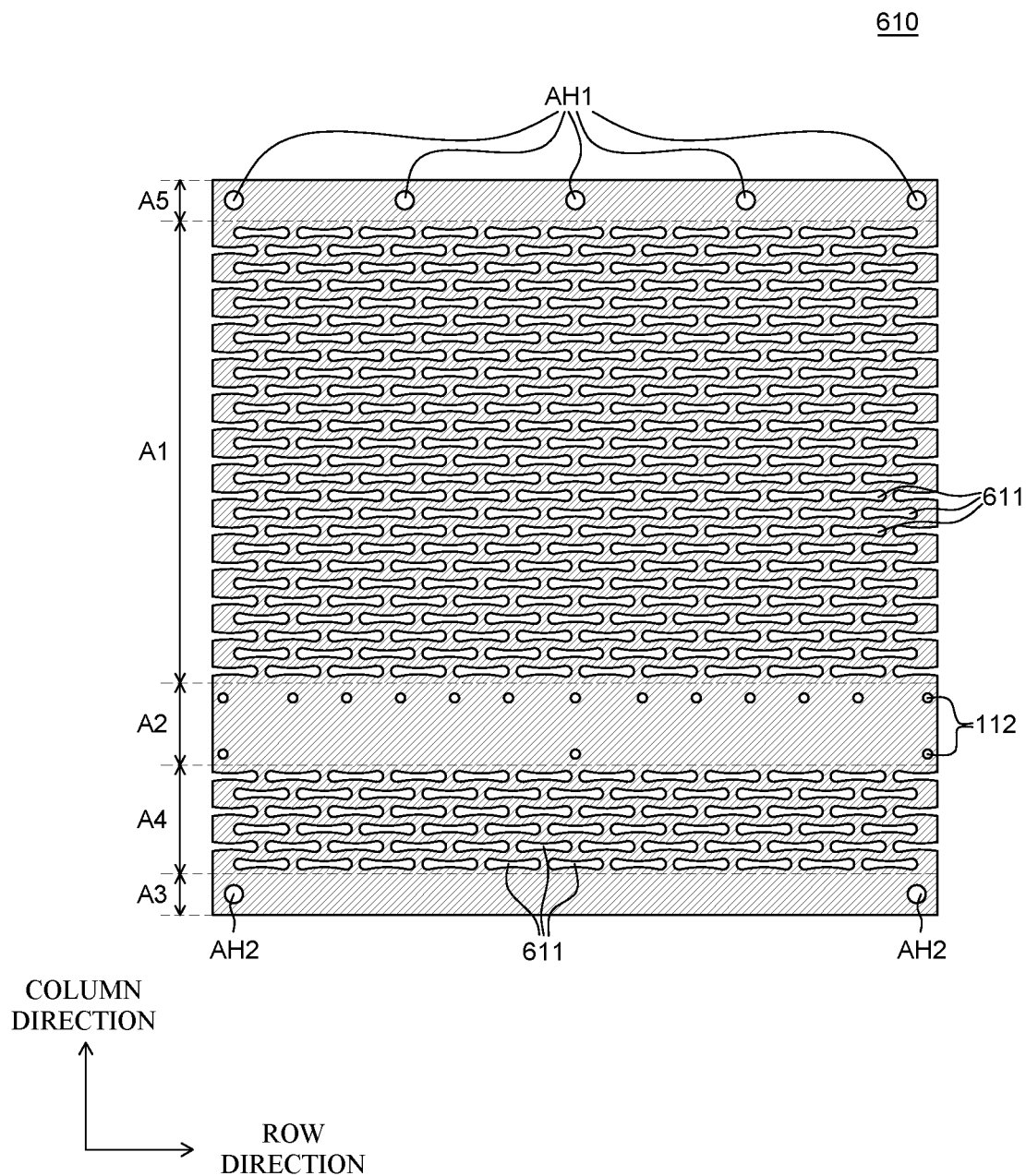
FIG. 6B is a plan view of a mid cover of a display device according to another exemplary embodiment of the present disclosure.

FIG. 6A is a plan view of a display part of a display device according to another exemplary embodiment of the present disclosure. FIG. 6B is a plan view of a mid cover of a display device according to another exemplary embodiment of the present disclosure. A display device 600 shown in FIGS. 6A and 6B is substantially identical to the display device 100 shown in FIGS. 1A to 4B except for a mid cover 610; and, therefore, the redundant description will be omitted.

Referring to FIGS. 6A and 6B, openings 611 identical to the opening 611 formed in the fourth area A4 are formed in the first area A1 of the mid cover 610. In the first area A1, a plurality of openings 611 is arranged and the display panel 120 is attached. Specifically, the first area A1 is wound around or unwounded from the roller 151 together with the display panel 120 and the plurality of back bars 170. The first area A1 may overlap at least the display panel 120 among the other elements of the display part DP.

When the display part DP is wound or unwound, the openings 611 may be deformed due to the stress applied to the display part DP. Specifically, when the display part DP is wound or unwound, the first area A1 of the mid cover 610 may be deformed as the openings 611 contract or expand. As the openings 611 contract or expand, it is possible to suppress the display panel 120 disposed on the first area A1 of the mid cover 610 from slipping, so that the stress applied to the display panel 120 can be reduced.

When the display panel 120 and the mid cover 610 are wound around the roller 151, due to the difference in the radius of curvature between the display panel 120 and the mid cover 610, there is a difference in the length between the display panel 120 and the mid cover. For example, the length of the mid cover 610 when it is wound around the roller 151 once may be different from the length of the display panel 120 when it is wound around the roller 151 once. Specifically, since the display panel 120 is disposed more to the outside of the roller 151 than the mid cover 610, the length of the display panel 120 when it is wound around the roller 151 once may be larger than the length of the mid cover 610 when it is wound around the roller 151 once. As such, when the display unit DP wound, there is a difference in the length between the mid cover 610 and the display panel 120 wound around the roller 151 due to the difference in the radius of curvature. As a result, the display panel 120 attached to the mid cover 610 may slide and thus may deviate from the original position. As used herein, a phenomenon that the display panel 120 slips from the mid cover 610 due to a difference in the radius of curvature and stress caused by winding may be defined as a slip phenomenon. If the slip is excessively large, the display panel 120 may be detached from the mid cover 610, or defects such as cracks may occur.

In this regard, in the display device 600 according to another exemplary embodiment of the present disclosure, even if stress is applied to the display part DP while the display part DP is wound or unwound, the plurality of openings 610 of the mid cover 611 can be deformed flexibly so that the stress applied to the mid cover 610 and the display panel 120 can be relieved. For example, when the mid cover 610 and the display panel 120 are wound around the roller 151, stress may be applied which deforms the mid cover 610 and the display panel 120 in the vertical direction. At this time, the plurality of openings 611 arranged in the first area A1 and the fourth area A4 of the mid cover 610 may be expanded in the vertical direction of the mid cover 610, and the length of the mid cover 610 can also be flexibly changed. As a result, the difference in the length between the mid cover 610 and the display panel 120 due to the difference in the radius of curvature in the course of winding the mid cover 610 and the display panel 120 can be compensated for by the plurality of openings 611 of the mid cover 610. In addition, the openings 611 are deformed in the course of winding the mid cover 610 and the display panel 120 so that stress applied to the display panel 120 from the mid cover 610 can also be relieved.

Referring to FIGS. 6A and 6B, the openings 611 are staggered with the openings 611 in adjacent rows. For example, the openings 611 arranged in a row are staggered with the openings 611 arranged in an adjacent row. Specifically, the centers of the openings 611 arranged in the odd rows may be staggered with the centers of the openings 611 arranged in the even rows. For example, they may be staggered by half the width of the openings 611 in the row direction. It is to be understood that the arrangement of the plurality of openings 611 illustrated in FIG. 6B is exemplary and is not limited thereto.

Referring to FIG. 6B, the openings 611 have the maximum width in the row direction larger than the maximum width in the column direction. That is to say, as shown in FIG. 6B, the maximum width of the openings 611 in the horizontal direction may be greater than the maximum width of the openings 611 in the vertical direction.

In the display device 600 according to another exemplary embodiment of the present disclosure, the plurality of back bars 170 is disposed on the rear surface of the mid cover 610, so that the flatness of the display part DP can be improved while the back bars 170 disposed on the rear side of the display panel 120 are not seen. In addition, the side strength can be improved even with the reduced thickness, and thus the reliability of the display device 100 can be improved.

In addition, in the display device 600 according to another exemplary embodiment of the present disclosure, even if stress is applied to the display part DP while the display part DP is wound or unwound, the plurality of openings 610 of the mid cover 611 can be deformed flexibly so that the stress applied to the mid cover 610 and the display panel 120 can be relieved.

<Structure of Mid Cover>

Figure 7A:
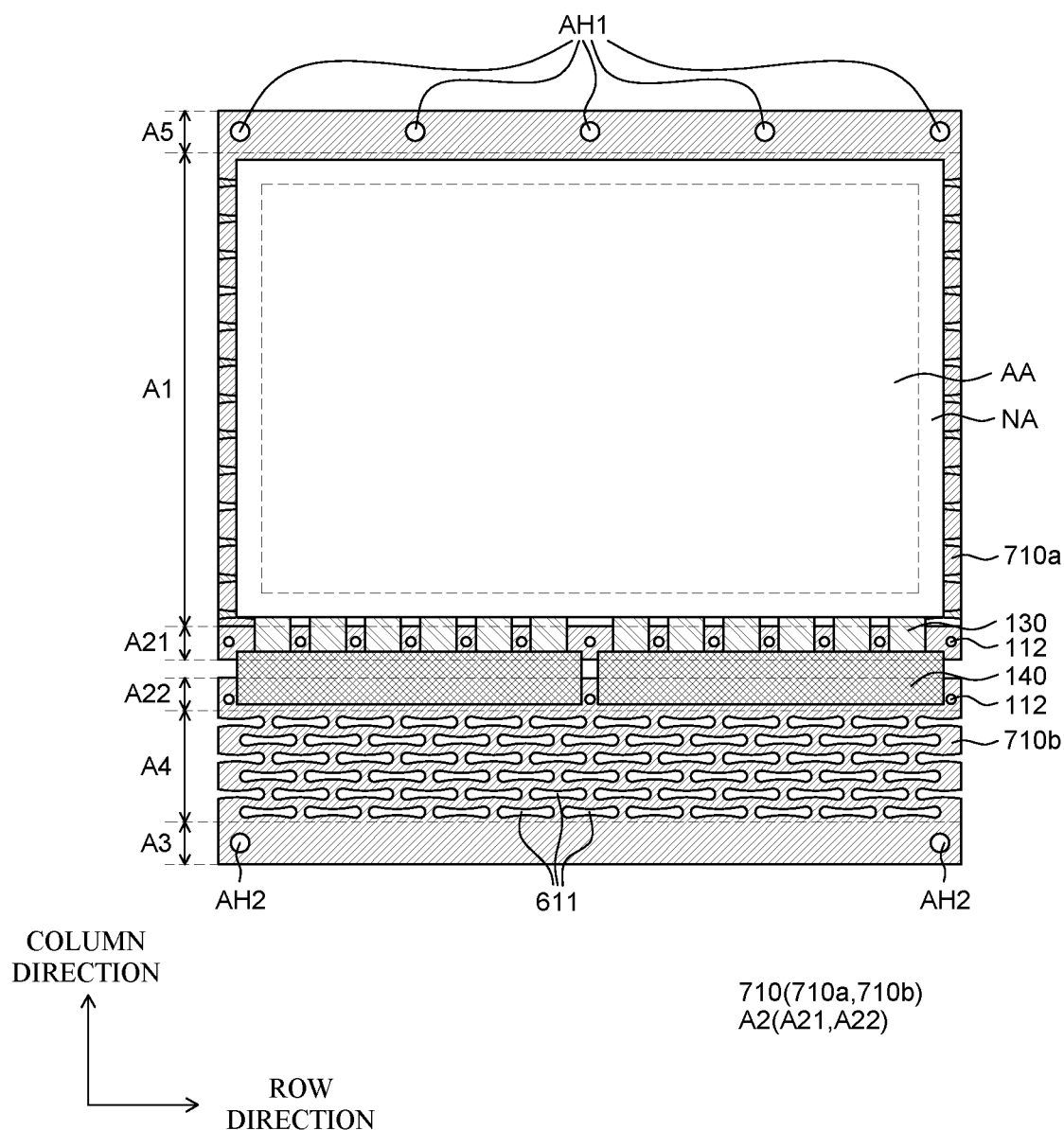
FIG. 7A is a plan view of a display part of a display device according to yet another exemplary embodiment of the present disclosure.
Figure 7B:
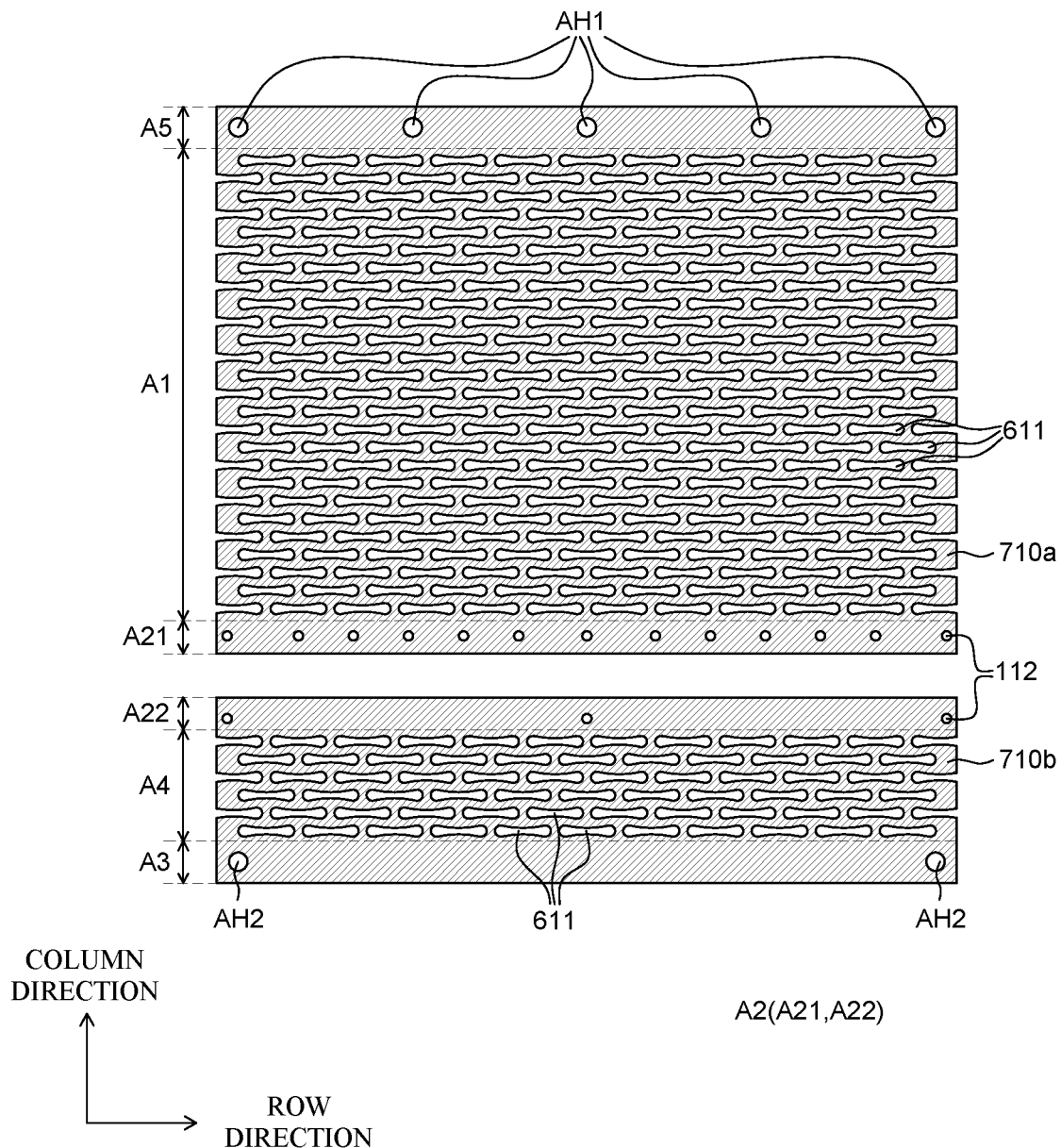
FIG. 7B is a plan view of a mid cover of a display device according to yet another exemplary embodiment of the present disclosure.

FIG. 7A is a plan view of a display part of a display device according to yet another exemplary embodiment of the present disclosure. FIG. 7B is a plan view of a mid cover of a display device according to yet another exemplary embodiment of the present disclosure. A display device 700 shown in FIGS. 7A and 7B is substantially identical to the display device 600 shown in FIGS. 6A to 6B except for a mid cover 710; and, therefore, the redundant description will be omitted.

Referring to FIGS. 7A and 7B, the mid cover 710 includes a first mid cover 710a and a second mid cover 710b. The first mid cover 710a and the second mid cover 710b may be formed separately from each other. The first mid-cover 710a and the second mid-cover 710b are separated at the boundary between a first sub-area A21 and a second sub-area A22, and the first sub-area A21 and the second sub-area A22 form a second area A2.

The first mid cover 710a is disposed to overlap the display panel 120. The second mid cover 710b is fixed to the roller 151. The first mid cover 710a and the second mid cover 710b are spaced apart from each other. In other words, there is a space between the first mid cover 710a and the second mid cover 710b. The first mid cover 710a and the second mid cover 710b may be connected by a base plate and a top cover.

The first mid cover 710a includes a first area A1 overlapping the display panel 120, a fifth area A5 extended away from the second mid cover 710b from the first area A1, and a first sub-area A21 extended from the first area A1 toward the second mid cover 710b. In addition, the second mid cover 710b includes a third area A3 fastened to the roller 151, a fourth area A4 extended from the third area A3 toward the first mid cover 710a, and a second sub-area A22 extended from the fourth area A4 toward the first mid-cover 710a.

The second mid cover 710b is fixed to the roller 151. The second mid cover 710b includes the third area A3, the fourth area A4 and a part of the second area A2 extended from the fourth area A4. The third area A3, the fourth area A4 and a part of the second area A2 extended from the fourth area A4 of the second mid cover 710b have the same width. In other words, the second mid cover 710b may be defined as areas having the same width in the row direction.

In the display device 700 according to this exemplary embodiment of the present disclosure, the mid cover 710 includes the first mid cover 710a and the second mid cover 710b spaced apart from each other, so that the mid cover 710 can be adopted for a variety of display panels having different sizes. As display devices are becoming larger and larger, so are display panels. Since the mid cover should be larger than the display panel, a single-piece mid cover must be produced in a large size. It is very difficult to produce a single-piece mid cover for a large display device. In contrast, in the display device 700 according to yet another exemplary embodiment of the present disclosure, the mid cover 710 includes the first mid cover 710a and the second mid cover 710b, which have smaller size than the existing mid cover. In addition, since the first mid cover 710a and the second mid cover 710b are fixed by the base plate, the top cover and the fixing member, the first mid cover 710a and the second mid cover 710b can perform the functionality of the existing mid cover and can be produced in a smaller size to improve productivity.

In the display device 700 according to yet another exemplary embodiment of the present disclosure, the plurality of back bars 170 is disposed on the rear surface of the mid cover 710, so that the flatness of the display part DP can be improved while the back bars 170 disposed on the rear side of the display panel 120 are not seen. In addition, the side strength can be improved even with the reduced thickness, and thus the reliability of the display device 100 can be improved.

In addition, in the display device 700 according to yet another exemplary embodiment of the present disclosure, even if stress is applied to the display part DP while the display part DP is wound or unwound, the plurality of openings 710 of the mid cover 711 can be deformed flexibly so that the stress applied to the mid cover 710 and the display panel 120 can be relieved.

<Shape of Back Bars>

Figure 8:
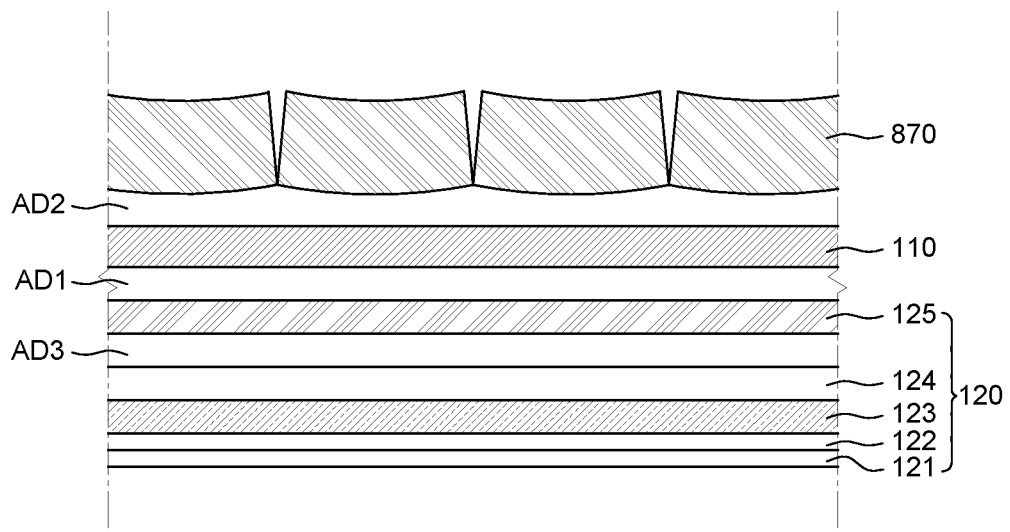
FIG. 8 is an enlarged, cross-sectional view of a display part of a display device according to yet another exemplary embodiment of the present disclosure.

FIG. 8 is an enlarged, cross-sectional view of a display part of a display device according to yet another exemplary embodiment of the present disclosure. A display device 800 shown in FIG. 8 is substantially identical to the display device 100 shown in FIGS. 1 to 4B except for a plurality of back bars 870; and, therefore, the redundant description will be omitted.

Referring to FIG. 8, each of the plurality of back bars 870 has curved upper and lower surfaces. Specifically, the upper and lower surfaces of the back bars 870 have a convex curved shape toward the mid cover 110. Therefore, when the display part is wound, the plurality of back bars 870 may be wound around the roller 151 while forming a curved surface along the surface shape of the roller 151.

In the display device 800 according to this exemplary embodiment, since the upper and lower surfaces of the back bars 870 have curved shapes, the stress generated on the display panel 120 when the display device 800 is wound can be reduced. Specifically, since the upper and lower surfaces of the back bars 870 have the curved shape convex toward the mid cover 110, the shape of the back bars 870 can conform to the shape of the roller 151. Accordingly, when the display device 800 is wound, the lower surfaces of the back bars 870 provide the curved shape conforming to the roller 151, so that the display panel 120 also can be wound conforming to the curved shape provided by the back bars 870 and thus the stress applied to the display panel 120 can be relieved. As the stress applied to the display panel 120 is relieved, it is possible to reduce cracks in the display part DP and to improve the reliability of the display panel 120.

Figure 9:
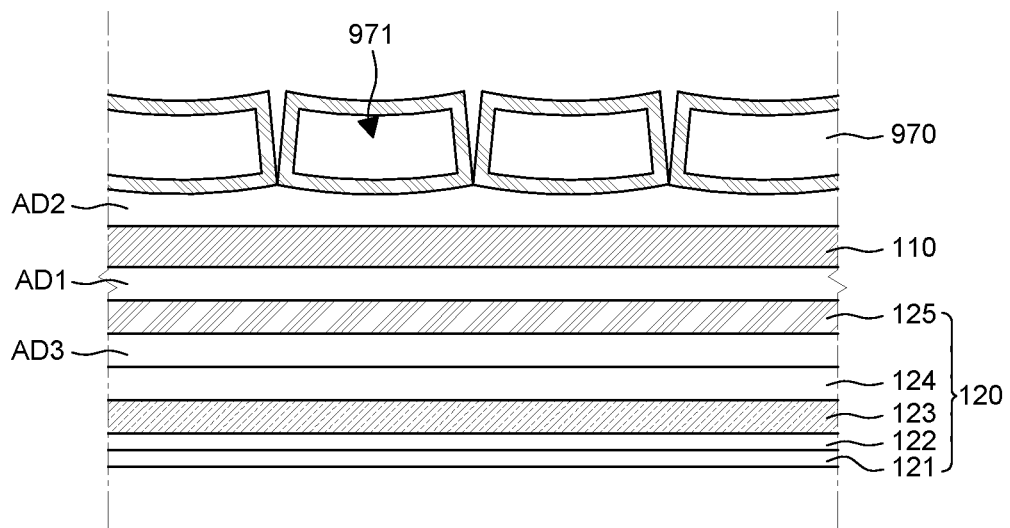
FIG. 9 is an enlarged, cross-sectional view of a display part of a display device according to yet another exemplary embodiment of the present disclosure.

FIG. 9 is an enlarged, cross-sectional view of a display part of a display device according to yet another exemplary embodiment of the present disclosure. A display device 900 shown in FIG. 9 is substantially identical to the display device 800 shown in FIG. 8 except for a plurality of back bars 970; and, therefore, the redundant description will be omitted.

A hollow 971 is disposed at the center of each of the plurality of back bars 970. The hollow 971 may be elongated along the row direction to be opened up to both ends of each of the back bars 970. The shape of the hollow 971 may conform to the shape of the back bars 970. It is, however, to be understood that the present disclosure is not limited thereto. The upper and lower surfaces of the hollow 971 may be curved surfaces having the same curvature as the upper and lower surfaces of the back bars 970. It is, however, to be understood that the present disclosure is not limited thereto.

In the display device 900 according to this exemplary embodiment, the same curved surfaces are disposed on the upper and lower surfaces of the back bars 970 at the center of each of the back bars 970, so that the stress generated on the display panel 120 when the display device 900 is wound can be reduced. Specifically, an empty space is formed at the center of each of the back bars 970 instead of a material having rigidity, so that stress applied to the mid cover 110 and the display panel 120 can be relieved. For example, when the mid cover 110 and the display panel 120 are wound around the roller 151, stress may be applied which deforms the mid cover 110 and the display panel 120 in the vertical direction. The hollow 971 may be elongated in the vertical direction and be more flexibly deformed. Accordingly, the difference in the length between the mid cover 110 and the display panel 120 due to the difference in the radius of curvature in the course of winding the mid cover 110 and the display panel 120 can be compensated for by the hollow 971 formed in each of the back bars 970. As the stress applied to the display panel 120 is relieved, it is possible to prevent cracks in the display part DP and to improve the reliability of the display panel 120.

Hereinafter, the effects of the display device 200 according to the exemplary embodiment of the present disclosure and the display device 800 according to the exemplary embodiment of the present disclosure will be described in detail with reference to Table 1.

Table 1 shows the stress-strain simulation results for Comparative Example and Examples. A display device according to Comparative Example is a typical display device which is different from the display device 600 according to the exemplary embodiment of the present disclosure in that no mid cover is disposed. Results of Example 1 were obtained from the display device 600 according to the exemplary embodiment of the present disclosure. Results of Example 2 were obtained from the display device 800 according to another exemplary embodiment of the present disclosure. In Comparative Example and Examples 1 and 2, aluminum having the Young's modulus of 69.3 GPa and the Poisson's ratio of 0.33 was employed as the plurality of back bars 670 and 870, a foam pad having the Young's modulus of 85 MPa and the Poisson's ratio of 0.3 was employed as the first adhesive layer AD1 and the second adhesive layer AD2, and a PET having the Young's modulus of 2.4 GPa and the Poisson's ratio of 0.4 was employed as the display panel 120. In Examples 1 and 2, the mid covers 610 and 810 had the thickness of 0.2 mm and were made of an anisotropic material having different Young's Moduli depending on the directions. The Young's Modulus of the mid cover 110 was set to 0.83 GPa in the winding direction, 56 GPa in the vertical direction of the winding direction, and 81 GPa in the thickness direction. The stress-strain simulations were carried out by apply force from above using a jig having the radius of 40R, i.e., by bending with the radius of 40R.

The stress-strain simulation results for Comparative Example, Examples 1 and 2 are shown in Table 1 below:

TABLE 1

|  | Comparative Example | Example 1 | Example 2 |
| --- | --- | --- | --- |
| Stress | 37.178 Mpa | 33.236 Mpa | 33.079 Mpa |
| Strain | 0.016895 | 0.013875 | 0.013816 |

First, in terms of stress, Example 1 exhibited a decrease in stress by about 10.6% compared to the stress of Comparative Example. Example 2 exhibited a decrease in stress by about 11.02% compared to the stress of Comparative Example.

Second, in terms of strain, Example 1 exhibited a decrease in strain by about 17.86% compared to the strain of Comparative Example. Example 2 exhibited a decrease in strain by about 18.22% compared to the strain of Comparative Example.

The exemplary embodiments of the present disclosure can also be described as follows:

According to an aspect of the present disclosure, a display device comprises a mid cover; a display panel disposed on a surface of the mid cover and having a plurality of pixels defined therein; a plurality of back bars disposed on an opposite surface of the mid cover; and a roller fixed to the mid cover, wherein the mid cover, the display panel and the plurality of back bars are wound around or unwound from the roller.

The mid cover may comprise a first area where the display panel is disposed; a second area where a printed circuit board electrically connected to the display panel is disposed; a third area fixed to the roller; and a fourth area between the second area and the third area, wherein the plurality of back bars is disposed in the first area.

The mid cover may comprise a plurality of openings arranged in the fourth area.

The plurality of openings may be further arranged in the first area.

The mid cover may comprise a first mid cover where the first area and a first sub-area of the second area extended from the first area are disposed; and a second mid cover spaced apart from the first mid cover, wherein the third area, the fourth area and a second sub-area of the second area extended from the fourth area are disposed.

A stress applied to the mid cover may be equal to or less than a yield stress of the mid cover when the mid cover is wound around the roller.

A cross-sectional shape of each of the plurality of back bars may be a trapezoidal shape or a triangular shape.

Upper and lower surfaces of the plurality of back bars may have a curved shape convex toward the surface of the mid cover.

The display device may further comprise an adhesive layer disposed between the mid cover and the plurality of back bars.

A width of the mid cover in a horizontal direction may be larger than a width of the display panel in the horizontal direction, and wherein a width of the back bars in the horizontal direction may be equal to or larger than the width of the mid cover in the horizontal direction.

According to another aspect of the present disclosure, a display device comprises a roller; a mid cover fixed to the roller; a first adhesive layer disposed on an upper surface of the mid cover; a display panel attached to the mid cover by the first adhesive layer; a second adhesive layer disposed on a lower surface of the mid cover; and a plurality of back bars attached to the mid cover by the second adhesive layer.

The plurality of back bars may fall in a part of the mid cover.

The plurality of back bars may overlap with the display panel.

The part of the mid cover where the back bars are disposed may comprise a plurality of openings.

Each of the plurality of back bars may comprise a first surface and a second surface facing the first surface and smaller than the first surface, and wherein the first surface may be disposed closer to the mid cover than the second surface is.

The first surface and the second surface may be curved surfaces.

Each of the plurality of back bars may comprise a hollow.

An angle between adjacent ones of the back bars may be $l/(R+t)$ to $2\tan^{-1}\{l/(2(t))\}$, wherein l denotes a length of a first surface in a shorter axis direction, R denotes a radius from a center of the roller to the back bars, and t denotes a distance between the first surface and a second surface.

The plurality of back bars may be made of metal or plastic.

The mid cover may be made of metal, rubber, plastic, or fabric.

A thickness of the mid cover may be smaller than a thickness of the plurality of back bars.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
    a mid cover;
    a display panel disposed on a surface of the mid cover and having a plurality of pixels defined therein;
    a plurality of back bars disposed on an opposite surface of the mid cover; and
    a roller fixed to the mid cover, wherein the mid cover, the display panel, and the plurality of back bars are wound around or unwound from the roller,
    wherein each of the plurality of back bars comprises a first surface and a second surface facing the first surface and smaller than the first surface, and wherein the first surface is disposed closer to the mid cover than the second surface is to the mid cover.

2. The display device of claim 1, wherein the mid cover comprises:
    a first area where the display panel is disposed;
    a second area where a printed circuit board electrically connected to the display panel is disposed;
    a third area fixed to the roller; and
    a fourth area between the second area and the third area, wherein the plurality of back bars is disposed in the first area.

3. The display device of claim 2, wherein the mid cover comprises a plurality of openings arranged in the fourth area.

4. The display device of claim 3, wherein the plurality of openings is further arranged in the first area.

5. The display device of claim 2, wherein the mid cover comprises:
    a first mid cover where the first area and a first sub-area of the second area extended from the first area are disposed; and
    a second mid cover spaced apart from the first mid cover, wherein the third area, the fourth area, and a second sub-area of the second area extended from the fourth area are disposed.

6. The display device of claim 1, wherein a stress applied to the mid cover is equal to or less than a yield stress of the mid cover when the mid cover is wound around the roller.

7. The display device of claim 1, wherein a cross-sectional shape of each of the plurality of back bars is a trapezoidal shape or a triangular shape.

8. The display device of claim 1, wherein the first surface and the second surface of the plurality of back bars have a curved shape convex toward the surface of the mid cover.

9. The display device of claim 8, further comprising:
    an adhesive layer disposed between the mid cover and the plurality of back bars.

10. The display device of claim 1, wherein a width of the mid cover in a horizontal direction is larger than a width of the display panel in the horizontal direction, and wherein a width of the back bars in the horizontal direction is equal to or larger than the width of the mid cover in the horizontal direction.

11. A display device comprising:
    a roller;
    a mid cover fixed to the roller;
    a first adhesive layer disposed on an upper surface of the mid cover;
    a display panel attached to the mid cover by the first adhesive layer;
    a second adhesive layer disposed on a lower surface of the mid cover; and
    a plurality of back bars attached to the mid cover by the second adhesive layer,
    wherein each of the plurality of back bars comprises a first surface and a second surface facing the first surface and smaller than the first surface, and wherein the first surface is disposed closer to the mid cover than the second surface is to the mid cover.

12. The display device of claim 11, wherein the plurality of back bars fall in a part of the mid cover.

13. The display device of claim 12, wherein the plurality of back bars overlap with the display panel.

14. The display device of claim 12, wherein the part of the mid cover where the back bars are disposed comprises a plurality of openings.

15. The display device of claim 11, wherein the first surface and the second surface are curved surfaces.

16. The display device of claim 11, wherein each of the plurality of back bars comprises a hollow.

17. The display device of claim 11, wherein an angle between adjacent ones of the plurality of back bars is $l/(R+t)$ to $2\tan-1\{l/(2t)\}$,
    wherein l denotes a length of a first surface in a shorter axis direction, R denotes a radius from a center of the roller to the plurality of back bars, and t denotes a distance between the first surface and the second surface.

18. The display device of claim 11, wherein the plurality of back bars are made of metal or plastic.

19. The display device of claim 11, wherein the mid cover is made of metal, rubber, plastic, or fabric.

20. The display device of claim 11, wherein a thickness of the mid cover is less than a thickness of the plurality of back bars.

* * * * *